US008518828B2

(12) United States Patent
Endoh et al.

(10) Patent No.: US 8,518,828 B2
(45) Date of Patent: Aug. 27, 2013

(54) SEMICONDUCTOR DEVICE FABRICATION METHOD

(75) Inventors: Tetsuo Endoh, Sendai (JP); Eiichi Nishimura, Nirasaki (JP)

(73) Assignees: Tokyo Electron Limited, Tokyo (JP); Tohoku University, Miyagi (JP)

( * ) Notice: Subject to any disclaimer, the term of this patent is extended or adjusted under 35 U.S.C. 154(b) by 603 days.

(21) Appl. No.: 12/623,556

(22) Filed: Nov. 23, 2009

(65) Prior Publication Data

US 2010/0130011 A1 May 27, 2010

(30) Foreign Application Priority Data

Nov. 26, 2008 (JP) .................. 2008-301147

(51) Int. Cl.
*H01L 21/311* (2006.01)
(52) U.S. Cl.
USPC .......................................... 438/696; 438/703
(58) Field of Classification Search
USPC .......................................................... 438/689
See application file for complete search history.

(56) References Cited

U.S. PATENT DOCUMENTS

| 5,100,503 | A | * | 3/1992 | Allman et al. ............... 438/694 |
| 5,328,810 | A | * | 7/1994 | Lowrey et al. ............... 430/313 |
| 7,115,525 | B2 | * | 10/2006 | Abatchev et al. ............ 438/725 |
| 2002/0001778 | A1 | * | 1/2002 | Latchford et al. ........... 430/313 |
| 2006/0102204 | A1 | * | 5/2006 | Jacobson et al. ............ 134/26 |
| 2006/0263699 | A1 | * | 11/2006 | Abatchev et al. ............ 430/5 |
| 2007/0264760 | A1 | * | 11/2007 | Roessiger .................... 438/142 |

FOREIGN PATENT DOCUMENTS

| JP | 2000-208434 | 7/2000 |
| JP | 2008-135632 | 6/2008 |
| WO | WO2006/127586 | 11/2006 |

OTHER PUBLICATIONS

Japanese Office Action dated Oct. 26, 2010 with partial English translation.
Korean Office Action mailed Feb. 11, 2011 with English translation.
Digh Hisamoto, Toru Kaga, Elji Takeda, "Impact of the Vertical SOI "Delta" Structure on Planar Device Technology" IEEE Transactions on Electron Devices vol. 38 No. 6, Jun. 1991.
T. Endoh, K. Shinmei, H. Sakuraba and F. Masuoka, "The analysis of the stacked-surrounding gate transistor (S-SGT) DRAM for the high speed and low voltage operation", IEICE Trans. Electron., vol. E81-C, No. 9, p. 1491, 1998.
T. Endoh et. al., "An Analytic Steady-State Current-Voltage Characteristics of Short Channel Fully-Depleted Surrounding Gate Transistor(FD-SGT)" IEICE Transactions on Electronics, vol. E80-C, No. 7, pp. 911-917, Jul. 1997.

* cited by examiner

*Primary Examiner* — Binh X Tran
*Assistant Examiner* — Thomas Pham
(74) *Attorney, Agent, or Firm* — IPUSA, PLLC

(57) ABSTRACT

According to a disclosed semiconductor device fabrication method according to one embodiment of the present invention, a layer having a line-and-space pattern extending in one direction is etched using another layer having a line-and-space pattern extending in another direction intersecting the one direction, thereby obtaining a mask having two-dimensionally arranged dots. An underlying layer is etched using the mask, thereby providing two-dimensionally arranged pillars.

12 Claims, 13 Drawing Sheets

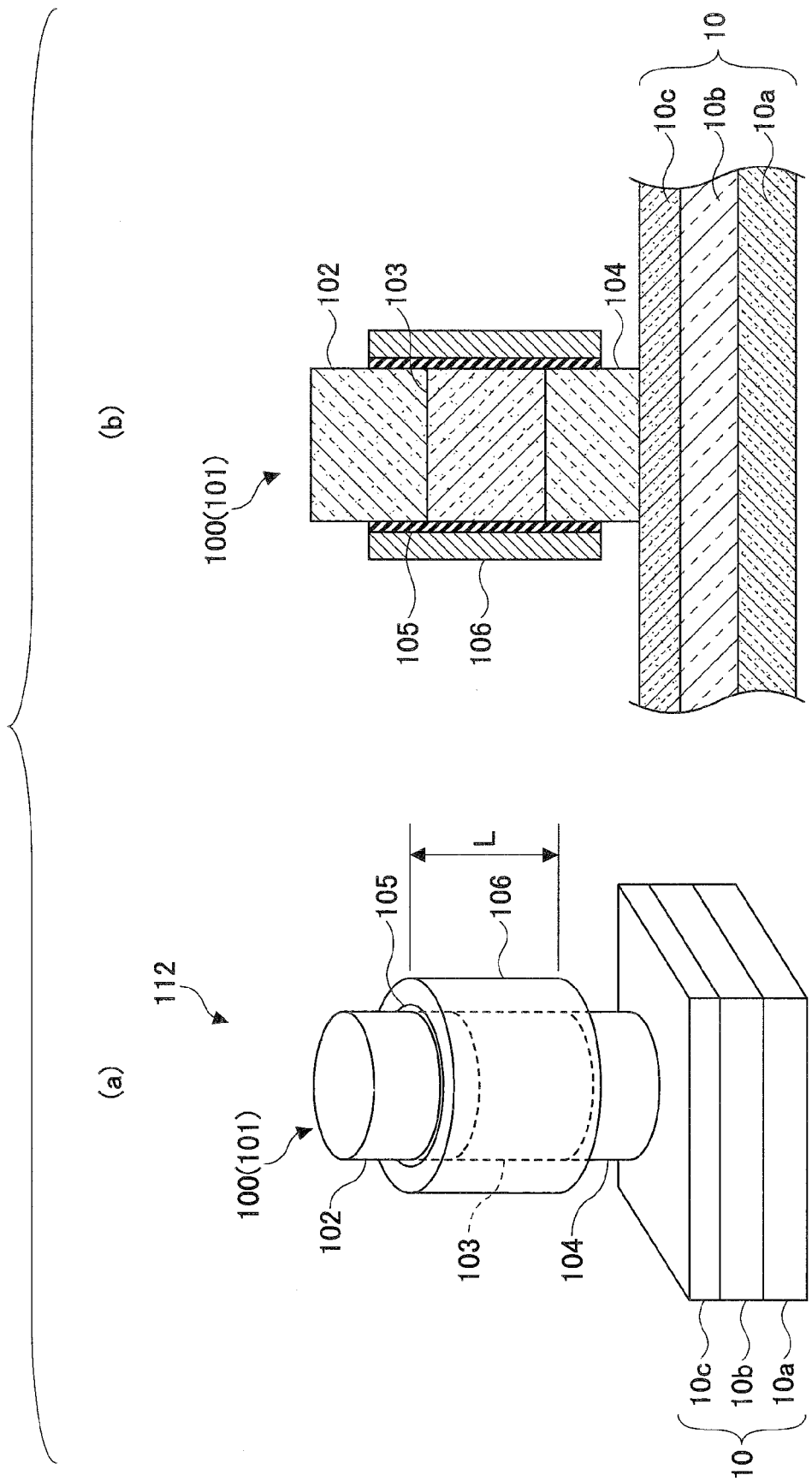

SEMICONDUCTOR DEVICE FABRICATION METHOD

CROSS-REFERENCE TO RELATED APPLICATIONS

The present application is based on Japanese Patent Application No. 2008-301147 filed with the Japanese Patent Office on Nov. 26, 2008, the entire contents of which are hereby incorporated herein by reference.

BACKGROUND OF THE INVENTION

1. Field of the Invention

The present invention relates to a semiconductor device fabrication method.

2. Description of the Related Art

In order to realize higher integration in large scale integrated (LSI) circuits, a three dimensional arrangement of device constituent elements has been expected. For example, cylindrical capacitors enabling relatively high capacitance through an increase in an electrode area while keeping a small footprint in a substrate is attracting much attention in the case of a memory device such as a dynamic random access memory (DRAM). Accordingly, a method for fabricating such an electrode for the capacitor has been proposed, for example, in Japanese Patent Application Publication No. 2008-135632.

In addition, as far as an active device is concerned, in order to solve a problem of an increased leakage current caused by reduction of a gate length in a planar field effect transistor (FET), much attention has been attracted by a fin field effect transistor (Fin-FET) enabling further miniaturization while keeping the leakage current at a low level (see Digh Hisamoto, Toru Kaga, Eiji Takeda, "Impact of the Vertical SOI "DELTA" Structure on Planar Device Technology" IEEE TRANSACTIONS ON ELECTRON DEVICES Vol. 38 No. 6, June 1991) and a stacked-surrounding gate transistor (S-SGT) enabling high speed performance and low consumption of electricity while keeping a smaller footprint (see T. Endoh, K. Shinmei, H. Sakuraba and F. Masuoka, "The analysis of the stacked-surrounding gate transistor (S-SGT) DRAM for the high speed and low voltage operation", IEICE Trans. Electron., vol. E81-C, No. 9, p. 1491, 1998).

Such a three dimensional arrangement makes it possible to realize a LSI circuit with higher integration and high performance.

In order to realize the three-dimensional device mentioned above, further miniaturization of device constituent elements is indispensable, and thus an extreme ultraviolet photolithography technology utilizing extreme ultraviolet (EUV) light having a wavelength of 13.5 nm, for example, is under vigorous development in order to realize a dimension lower than a critical dimension that can be realized by conventional or current photolithography technology. However, such photolithography technology has not been in practical use partly because it takes a long time to expose a photoresist film when using EUV light. Therefore, another semiconductor device fabrication method that does not rely on such photolithography has long been desired in order to realize a miniaturized three-dimensional device without waiting for the advent of new photolithography technologies including the EUV photolithography.

The present invention has been made in view of the above, and is directed to a semiconductor device fabrication method that enables fabricating a miniaturized three-dimensional semiconductor device.

SUMMARY OF THE INVENTION

According to a first aspect of the present invention, there is provided a semiconductor device fabrication method. This method includes steps of: stacking a first layer, a second layer, a third layer, and a fourth layer in this order on a substrate; processing the fourth layer into a first mask layer having a first pattern of stripes extending in a first direction; processing the third layer using the first mask layer into a first sacrifice layer having the first pattern; forming a fifth layer to cover at least the first sacrifice layer; thinning the fifth layer so that the fifth layer remains on side walls of the first sacrifice layer; removing the first sacrifice layer to form a first side wall layer having a second pattern of stripes extending in the first direction; processing the second layer using the first side wall layer into a second mask layer having the second pattern; forming a sixth layer to bury the second mask layer; forming a seventh layer on the sixth layer; processing the seventh layer into a third mask layer having a third pattern of stripes extending in a second direction intersecting the first direction; processing the sixth layer using the third mask layer into a second sacrifice layer having the third pattern; forming an eighth layer to cover at least the second sacrifice layer; thinning the eighth layer so that the eighth layer remains on side walls of the second sacrifice layer; removing the second sacrifice layer to form a second side wall layer having a fourth pattern of stripes extending in the second direction; processing the second mask layer using the second side wall layer into a fourth mask layer having dots arrayed in the first and the second directions; processing the first layer using the fourth mask layer to form a fifth mask layer; and processing the substrate using the fifth mask layer.

According to a second aspect of the present invention, there is provided a semiconductor device fabrication method. This method includes steps of: stacking a third sacrifice layer, a first layer, a second layer, a third layer, and a fourth layer in this order on a substrate; processing the fourth layer into a first mask layer having a first pattern of stripes extending in a first direction; processing the third layer using the first mask layer into a first sacrifice layer having the first pattern; forming a fifth layer to cover at least the first sacrifice layer; thinning the fifth layer so that the fifth layer remains on side walls of the first sacrifice layer; removing the first sacrifice layer to form a first side wall layer having a second pattern of stripes extending in the first direction; processing the second layer using the first side wall layer into a second mask layer having the second pattern; forming a sixth layer to bury the second mask layer; forming a seventh layer on the sixth layer; processing the seventh layer into a third mask layer having a third pattern of stripes extending in a second direction intersecting the first direction; processing the sixth layer using the third mask layer into a second sacrifice layer having the third pattern; forming an eighth layer to cover at least the second sacrifice layer; thinning the eighth layer so that the eighth layer remains on side walls of the second sacrifice layer; removing the second sacrifice layer to form a second side wall layer having a fourth pattern of stripes extending in the second direction; processing the third sacrifice layer using the second side wall layer and the second mask layer to make holes that reach the substrate; forming a second buried layer that buries the holes; thinning the second buried layer to expose the third sacrifice layer; removing the third sacrifice layer to form a sixth mask layer from the second buried layer; and processing the substrate using the sixth mask layer.

BRIEF DESCRIPTION OF THE DRAWINGS

FIG. 15 illustrates an example of a three dimensional device that may be fabricated using pillars obtained in accordance with an embodiment of the present invention.

DETAILED DESCRIPTION OF THE PREFERRED EMBODIMENT

Figure 1:
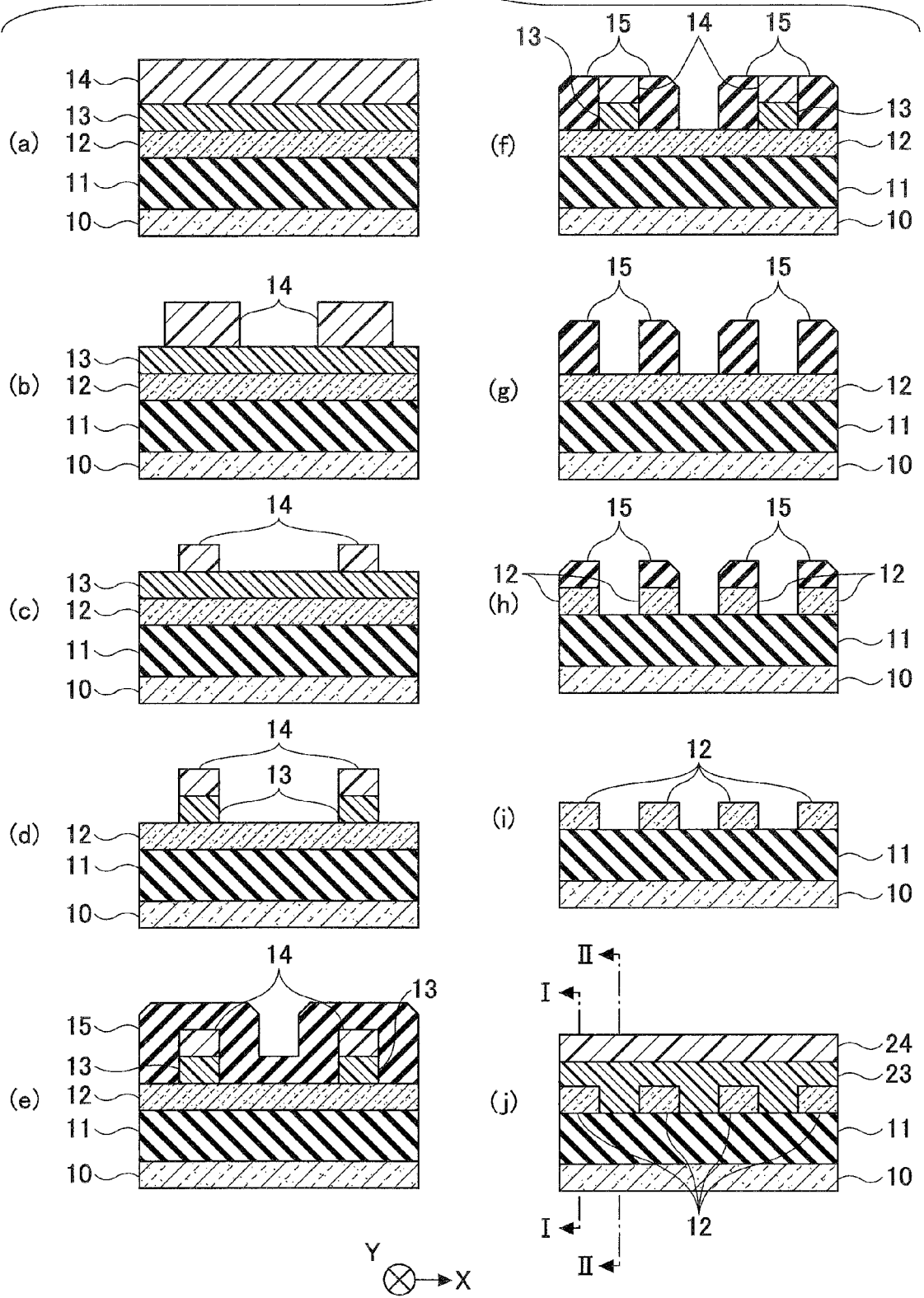
FIG. 1 schematically illustrates a semiconductor device fabrication method according to a first embodiment of the present invention.

According to an embodiment of the present invention, there is provided a semiconductor device fabrication method that enables fabricating a miniaturized three-dimensional semiconductor device.

Non-limiting, exemplary embodiments of the present invention will now be described with reference to the accompanying drawings. In the drawings, the same or corresponding reference marks are given to the same or corresponding members or components. It is to be noted that the drawings are illustrative of the invention, and there is no intention to indicate scale or relative proportions among the members or components, or between thicknesses of various layers. Therefore, the specific thickness or size should be determined by a person having ordinary skill in the art in view of the following non-limiting embodiments.

First Embodiment

Figure 2:
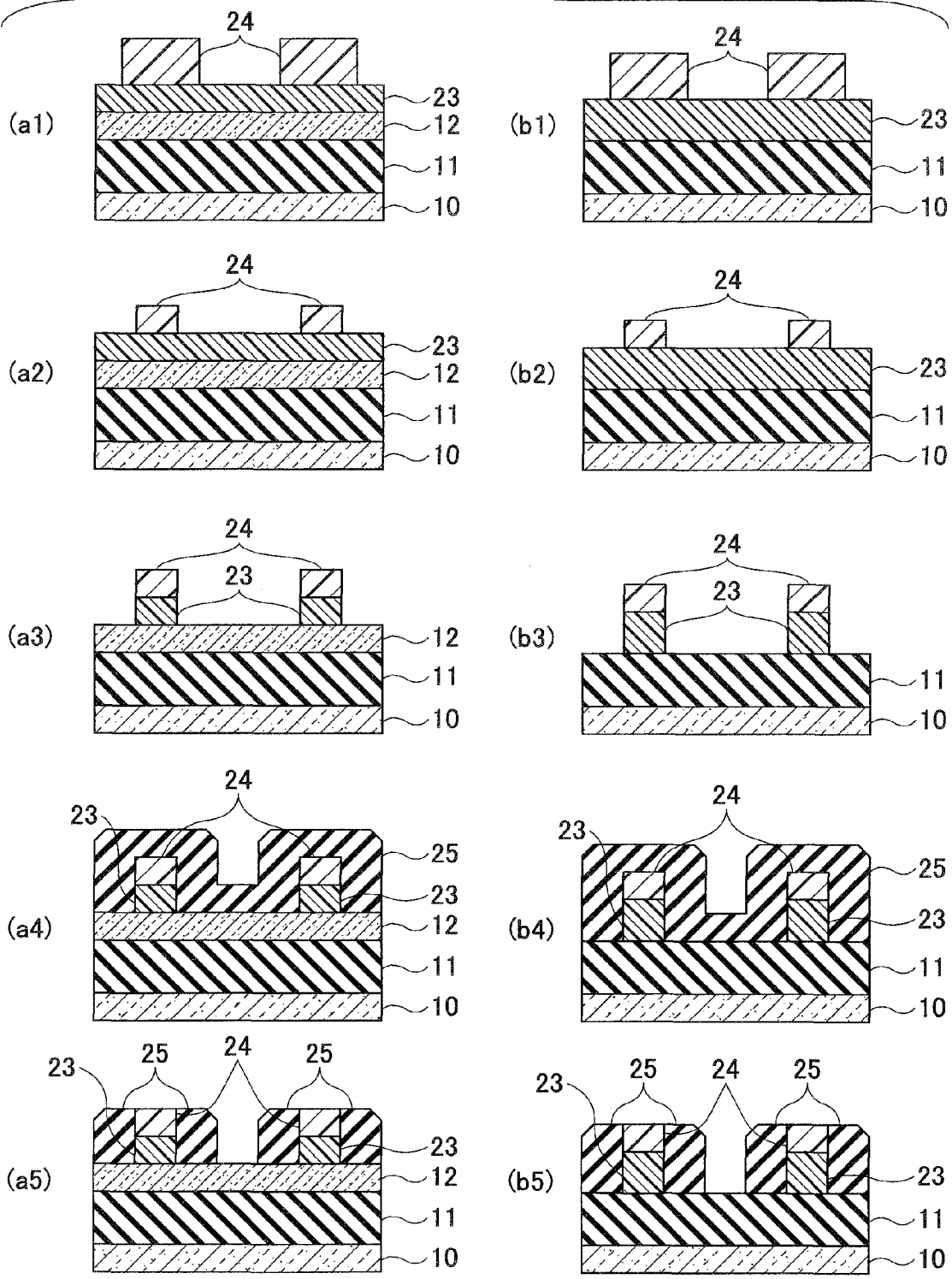
FIG. 2 schematically illustrates the semiconductor device fabrication method according to the first embodiment, in succession to FIG. 1.
Figure 3:
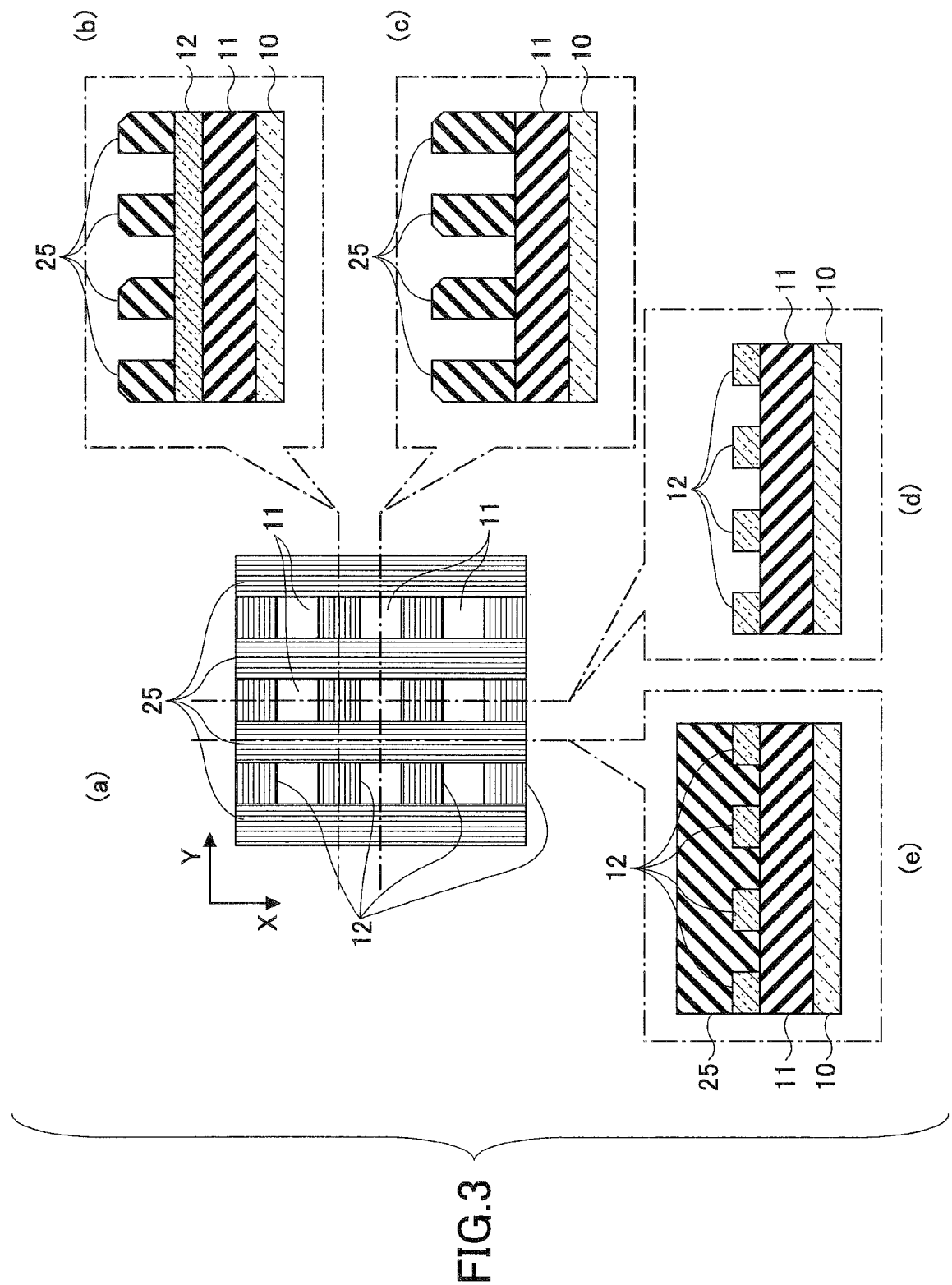
FIG. 3 schematically illustrates the semiconductor device fabrication method according to the first embodiment, in succession to FIG. 2.

FIGS. 1 through 3 are explanatory views for explaining a semiconductor device fabrication method according to a first embodiment of the present invention, wherein cross sections of a substrate that undergoes corresponding primary processes are schematically illustrated in part.

Referring to a subsection (a) of FIG. 1, a first layer 11, a second layer 12, a third layer 13 and a fourth layer 14 are formed in this order on a substrate 10. These layers 11 through 14 serve as a mask layer or a sacrifice layer, and the substrate is subjected to a final etching process in this embodiment.

First, the fourth layer 14 is patterned into a predetermined shape, as shown in a subsection (b) of FIG. 1. Next, the patterned fourth layer 14 is entirely shrunk into an etching mask to be used for etching the underlying third layer 13. Because the fourth layer 14 serves as the etching mask for the third layer 13, the fourth layer 14 is made of a material having a sufficient etching ratio with respect to the third layer 13.

In addition, the fourth layer 14 has a thickness that allows the fourth layer 14 to remain after etching or over-etching the third layer 13. For example, a thickness T14 of the as-formed fourth layer 14 shown in the subsection (a) of FIG. 1 is preferably determined to satisfy the following expression:

$$T14 \geq R14 \times (T13/R13+\alpha)+S14$$

Hence, $$T14 \geq T13 \times ER43 + R14 \times \alpha + S14 \tag{1}$$

where

S14 is an amount of shrinkage of the fourth layer 14,

T13 is a thickness of the third layer 13,

R13 is an etching rate at which the third layer 13 is etched,

R14 is an etching rate during the etching of the third layer 13,

ER43 is an etching ratio (=R14/R13), and

α is an over-etching time.

Next, the third layer 13 is etched using the fourth layer 14 as the mask until an upper surface of the second layer 12 is exposed. With this, the third layer 13 now has substantially the same top view shape as that of the patterned fourth layer 14 (mask), as shown in a subsection (d) of FIG. 1. The etched third layer 13 serves in turn as a base structure for use in forming a fifth layer 15. Therefore, the third layer 13 is made of a material capable of providing a base for forming the fifth layer 15. Specifically, the third layer 13 is made of a material so that the fifth layer 15 can be formed on upper and side surfaces of the third layer 13 of the material.

Incidentally, a residual fourth layer 14 remaining on the third layer 13 may also serve as the base structure for the fifth layer 15 in this embodiment.

Therefore, the fourth layer 14 is preferably made of a material so that the fifth layer 15 can be formed on upper and side surfaces of the fourth layer 14. However, the fourth layer 14 may be removed after etching the third layer 13, so that the fifth layer 15 is formed only on the upper and side surfaces of the third layer 13.

Referring to a subsection (e) of FIG. 1, the fifth layer 15 is deposited on the upper surfaces of the fourth layer 14 and the second layer 12 and the side surfaces of the third layer 13 and the fourth layer 14 by various deposition methods including chemical vapor deposition utilizing a heated catalyst, molecular layer deposition (MLD), and the like.

Next, the fifth layer 15 is etched back so that the upper surfaces of the second layer 12 and the fourth layer 14 are exposed as shown in a subsection (f) of FIG. 1. With this, the fifth layer 15 remains only on the side surfaces of the third layer 13 and the fourth layer 14. Then, the third layer 13 and the fourth layer 14 are removed, so that only the fifth layer 15 having a predetermined pattern remains on the second layer 12. This fifth layer 15 serves as an etching mask with respect to the second layer 12. Therefore, the fifth layer 15 is made of a material having a sufficient etching ratio with respect to the second layer 12.

Incidentally, referring to subsections (g) and (f) of FIG. 1, a height H15 of the fifth layer 15 as the etching mask is substantially the same as a total thickness of the third layer 13 and the fourth layer 14. Namely, the height H15 of the fifth layer 15 can be determined by the thickness T13 of the third layer 13. When determining the thickness T13 of the third layer 13, the following relationship is preferably considered, for example.

$$T13+RT14=H15\geq ER52\times T12+\beta\times R15 \qquad (2)$$

where
T12 is a thickness of the second layer 12,
H15 is a thickness of the fifth layer 15,
R12 is an etching rate of the second layer 12,
R15 is an etching rate of the fifth layer 15 when etching the second layer 12,
RT14 is a remaining thickness of the fourth layer 14,
ER52 is an etching ratio (=R15/R12), and
β is an over-etching time.

Incidentally, RT14 is expressed from the expression (1) as follows:

$$RT14=T14-R14\times(T13/R13+\beta)-S14.$$

Next, the second layer 12 is etched using the fifth layer 15 as a mask as shown in the subsection (g) of FIG. 1. With this, portions of the second layer 12 that are not covered by the fifth layer 15 are removed, so that an upper surface of the first layer 11 is exposed, as shown in a subsection (h) of FIG. 1. Subsequently, the fifth layer 15 remaining on the second layer 12 is removed, and thus the second layer 12 having a predetermined pattern remains on the first layer 11, as shown in a subsection (i) of FIG. 1.

Next, a sixth layer 23 is formed on the first layer 11 so that the second layer 12 having the predetermined pattern is buried by the sixth layer 23, as shown in a subsection (j) of FIG. 1. As shown, the sixth layer 23 has a flat upper surface, on which in turn a seventh layer 24 is formed.

Subsequent procedures are explained with reference to FIG. 2. Subsections (a1) through (a5) of FIG. 2 correspond to cross sections taken along I-I line in the subsection (j) of FIG. 1, and subsections (b1) through (b5) of FIG. 2 correspond to cross sections taken along II-II line in the subsection (j) of FIG. 1.

The seventh layer 24 is patterned and thus has a predetermined pattern as shown in the subsections (a1) and (b1) of FIG. 2. The patterned seventh layer 24 extends in a direction intersecting an extending direction of the second layer 12. Then, the seventh layer 24 is shrunk as shown in subsections (a2) and (b2) of FIG. 2. With this, an etching mask for use in etching the underlying sixth layer 23 is formed. Namely, the seventh layer 24 is preferably made of a material having a sufficient etching ratio with respect to the sixth layer 23.

In addition, the seventh layer 24 has a thickness that allows the seventh layer 24 to remain after etching (and slightly over-etching) the sixth layer 23.

For example, the thickness of the as-formed seventh layer 24 may be determined in the same manner as using the expression (1) for determining the thickness of the fourth layer 14.

Next, the sixth layer 23 is etched using the seventh layer 24 as a mask, so that the sixth layer 23 now has substantially the same top view shape as the mask, as shown in subsections (a3) and (b3) of FIG. 2. After this etching, the second layer 12 is exposed in the subsection (a3) of FIG. 2, and the first layer 11 is exposed in the subsection (b3) of FIG. 2.

The etched sixth layer 23 serves as a base structure for use in forming an eighth layer 25 (described later). Therefore, the sixth layer 23 is made of a material capable of providing a base for forming the eighth layer 25. Specifically, the sixth layer 23 is made of a material so that the eighth layer 25 can be formed on upper and side surfaces of the sixth layer 23.

Incidentally, the seventh layer 24 remaining on the sixth layer 23 may also serve as the base structure for the eighth layer 25 in this embodiment. Therefore, the seventh layer 24 is also preferably made of a material so that the eighth layer 25 can be formed on upper and side surfaces of the seventh layer 24. However, the seventh layer 24 may be removed after etching the sixth layer 23, so that the eighth layer 25 is formed only on the upper and side surfaces of the sixth layer 23.

Next, the eighth layer 25 is deposited on the first layer 11 and the second layer 12 by various deposition methods including chemical vapor deposition (CVD) utilizing a heated catalyst, molecular layer deposition (MLD), and the like, so that the seventh layer 24 and the sixth layer 23 (subsections (a4) and (b4) of FIG. 2) are buried by the eighth layer 25. After this, the eighth layer 25 is etched back so that upper surfaces of the seventh layer 24, the second layer 12, and the first layer 11 are exposed as shown in subsections (a5) and (b5) of FIG. 2.

Then, when the seventh layer 24 and the sixth layer 23 are removed, a structure shown in FIG. 3 is obtained. Referring to a subsection (a) of FIG. 3, which is a plan view, a lattice pattern where the eighth layer 25 and the second layer 12 are stacked one above the other and intersect each other is observed. In openings of the lattice (portions surrounded by beams of the lattice), the first layer 11 is exposed.

As shown in a subsection (b) of FIG. 3, the second layer 12 is formed on the first layer 11 and the eighth layer 25 is formed on the second layer 12 in a cross section taken along a dashed line extending in a longitudinal direction of the second layer 12 (Y-axis direction). Additionally, as shown in a subsection (c) of FIG. 3, the eighth layer 25 is formed directly on the first layer 11 in a cross section taken along a dashed line extending in the Y-axis direction between lines of the second layer 12. On the other hand, as shown in a subsection (e) of FIG. 3, the lines of the second layer 12 are arrayed at a predetermined pitch, and the eighth layer 25 is formed to bury the second layer 12. Additionally, as shown in a subsection (d) of FIG. 3, the lines of the second layer 12 are arrayed at a predetermined pitch without being buried by the eighth layer 25.

Figure 4:
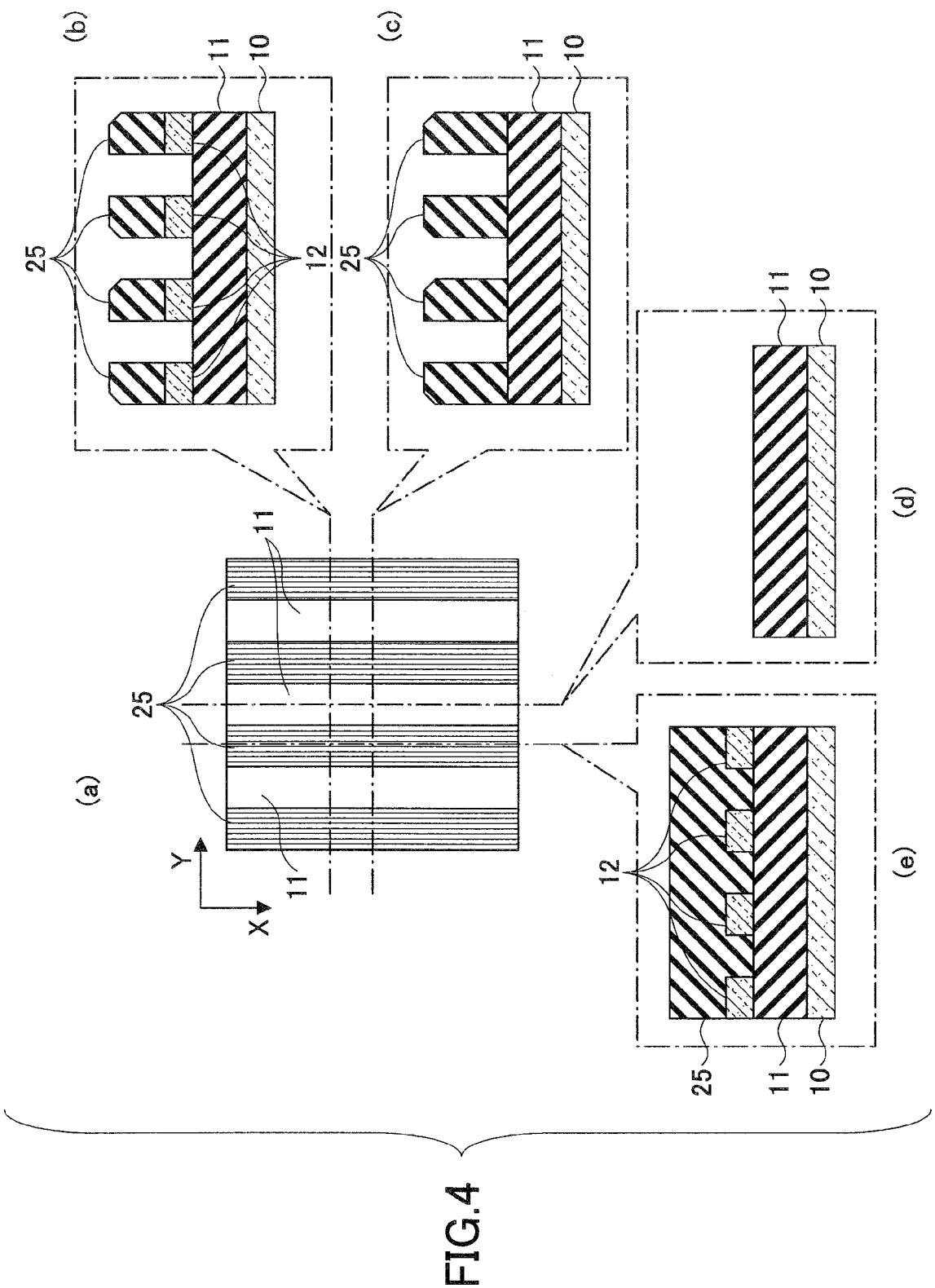
FIG. 4 schematically illustrates the semiconductor device fabrication method according to the first embodiment, in succession to FIG. 3.

Next, potions of the second layer 12 exposed between lines of the eighth layer 25 (see the subsection (b) of FIG. 3) are removed using the eighth layer 25 as a mask, and thus the first layer 11 is entirely exposed between the lines of the eighth layer 25, as shown in a subsection (a) of FIG. 4, which is a plan view. As most appropriately illustrated in a subsection (b) of FIG. 4, the lines of the second layer 12 are arrayed below and in a longitudinal direction of the eighth layer 25 (a direction perpendicular to the paper surface of FIG. 4).

Figure 5:
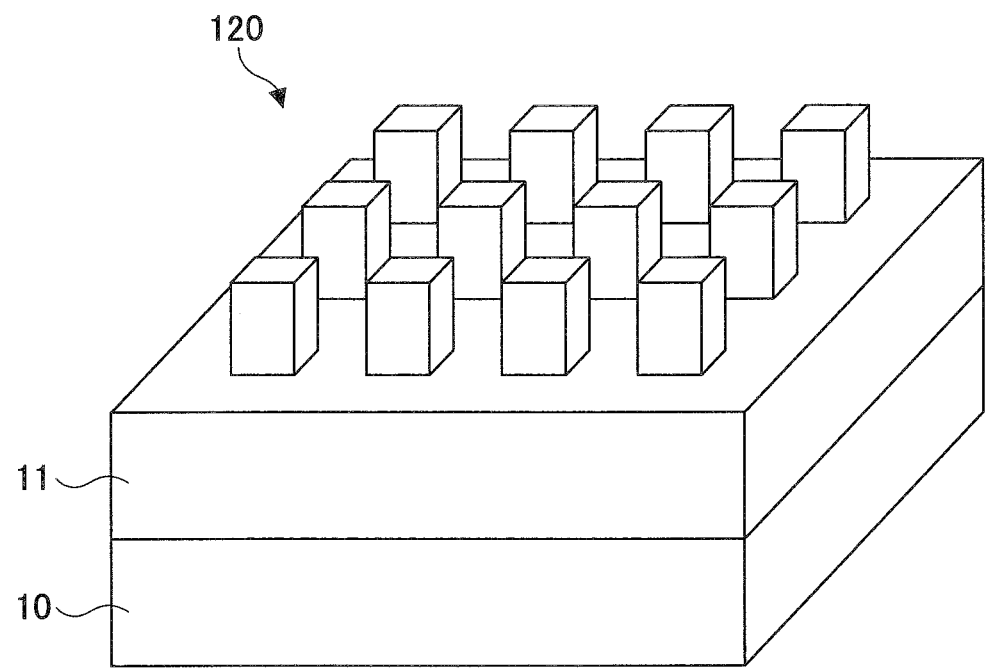
FIG. 5 schematically illustrates the semiconductor device fabrication method according to the first embodiment, in succession to FIG. 4.
Figure 6:
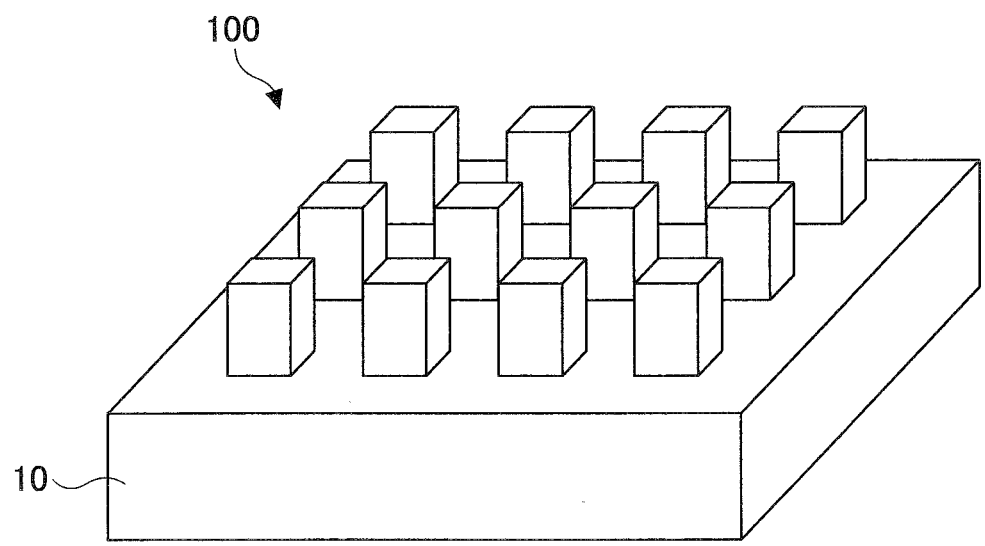
FIG. 6 schematically illustrates the semiconductor device fabrication method according to the first embodiment, in succession to FIG. 5.

Then, as shown in FIG. 5, the eighth layer 25 is removed, and as a result, dots 120 arranged in an array are obtained from the second layer 12 on the first layer 11. After this, the first layer 11 is etched using the dots 120 as a mask, according to which portions of the first layer 11 that are not covered by the dots 120 are removed, so that the substrate 10 is exposed, and other portions of the first layer 11 that are covered by the dots 120 remain. Therefore, dots of the first layer 11 are formed below the dots 120. Next, the dots 120 and the dots of the first layer 11 remaining below the dots 120 are used as a mask to etch the substrate 10, and then the mask is removed. As a result, two-dimensionally arranged pillars 100 are obtained on the substrate 10, as shown in FIG. 6.

Incidentally, in order that the dots 120 formed from the second layer 12 appropriately serve as a mask with respect to the first layer 11, the second layer 12 is made of a material having a sufficient etching ratio with respect to the first layer 11. In addition, the second layer 12 preferably has a thickness that allows the second layer 12 to remain on the first layer 11 after the first layer 11 is etched and slightly over-etched. For example, the thickness T12 of the as-formed second layer 12 shown in the subsection (a) of FIG. 1 is preferably determined to satisfy the following expression:

$$T12 \geq R12 \times (T11/R11 + \alpha)$$

Hence, $$T12 \geq T11 \times ER21 + R12 \times \alpha \quad (3)$$

where
T11 is a thickness of the first layer 11,
R11 is an etching rate of the first layer 11,
R12 is an etching rate of the second layer 12 when etching the first layer 11,
ER21 is an etching ratio (=R12/R11), and
α is over-etching time.

In addition, when determining the thickness of the first layer, the thickness of the dots 120 remaining on the dots of the first layer 11, namely the second layer 12, is preferably taken into consideration.

In addition, because the dots of the first layer 11 also serve as a mask with respect to the substrate 10, the first layer 11 is made of a material having a sufficient etching ratio with respect to the substrate 10. The first layer 11 has a thickness that allows the first layer 11 to remain on the substrate 10 after the substrate 10 is etched and slightly over-etched. For example, the thickness T11 of the as-formed first layer 11 is preferably determined to satisfy the following expression:

$$T11 \geq R11 \times (D10/R10)$$

Hence, $$T11 \geq D10 \times ER10 \quad (3)$$

where
D10 is an etching depth of the substrate 10 (a height of the pillars 100),
R10 is an etching rate of the substrate 10,
R11 is an etching rate of the first layer 11 when the substrate 10 is etched, and
ER10 is an etching ratio (=R11/R10).

Materials of the substrate 10 and the first layer 11 through the fourth layer 14 may be determined as follows.

First, the substrate 10 is preferably selected in accordance with a characteristic or specification of a semiconductor device to be fabricated according to the semiconductor device fabrication method according to an embodiment of the present invention. For example, the substrate 10 may be a semiconductor wafer such as a silicon wafer, or a semiconductor wafer with a semiconductor layer formed on the surface of the semiconductor wafer. The semiconductor layer formed on the surface of the semiconductor wafer may be a single layer or a multilayered film. In the case of the multilayered film, the constituent layers may include an n-type semiconductor layer and a p-type semiconductor. In addition, the semiconductor layer may be formed of a material different from the material of the semiconductor wafer. For example, the substrate 10 may be composed of a silicon wafer and a silicon germanium (SiGe) layer formed on the silicon wafer.

In addition, the substrate 10 may be composed by sticking two semiconductor wafers together. Moreover, the substrate 10 may be made of not only silicon but also compound semiconductors including SiGe, gallium arsenide (GaAs), indium phosphide (InP) and the like.

The first layer 11, the second layer 12, the third layer 13 (the sixth layer 23), and the fourth layer 14 (the seventh layer 24) may be made of any materials as long as the materials allow these layers to have functions as an etching mask or a sacrifice layer, and have the aforementioned characteristic with respect to another layer on which the functions are demonstrated.

The first layer 11 preferably has a sufficient etching ratio (of three or more, for example) with respect to the substrate 10, which is etched using the first layer 11 (dots) as a mask; the second layer 12 preferably has a sufficient etching ratio (of three or more, for example) with respect to the first layer 11; the third layer 13 and the fourth layer 14 preferably have a large etching ratio (of five or more, for example) with respect to the second layer 12; and the fifth layer 15 preferably has a sufficient etching ratio (of three or more) with respect to the second layer 12.

The first layer 11 may be made of, for example, but not limited to silicon nitride, silicon oxynitride, silicon oxide, and the like. The second layer 12 may be formed of, for example, but not limited to amorphous silicon, polycrystalline silicon, single crystal silicon, and the like. In addition, the third layer 13 may be, for example, but not limited to an anti-reflection film, and the fourth layer 14 may be formed of, for example, but not limited to photoresist, silicon boron nitride (SiBN) and the like. Moreover, the fifth layer 15 and the eighth layer 25 may be formed of, for example, but not limited to silicon nitride, silicon oxynitride, silicon oxide and the like. With any combination of materials selected from the above, the pillars 100 shown in FIG. 6 can be ft/wed according to the semiconductor device fabrication method of an embodiment of the present invention. Incidentally, the above materials may contain a slight amount of other constituent elements and dopants as long as the functions and/or characteristic of each layer are realized. In addition, each layer may be formed of a multilayered film, an example of which is the second layer 12 composed of an amorphous silicon layer and a polycrystalline silicon layer.

Next, the semiconductor device fabrication method according to the first embodiment of the present invention and its advantages are specifically explained referring to a specific example where the first layer 11 is made of silicon nitride, the second layer 12 is made of amorphous silicon, the third layer 13 is an anti-reflection film, the fourth layer 14 is a photoresist film, and the substrate 10 is a silicon wafer.

Referring to the subsection (a) of FIG. 1, a silicon nitride layer 11, an amorphous silicon layer 12, an anti-reflection layer (referred to as BARC hereinafter) 13, and a photoresist layer 14 are formed on a silicon wafer 10 subjected to etching.

Next, the photoresist layer 14 is exposed to exposure light through a predetermined photomask, and developed and thus patterned. In this example, the photoresist layer 14 now has a line-and-space pattern. In this pattern, a line width is about 60+/−6 nm and a line spacing (space width) is about 60+/−6 nm, which correspond to the lowest dimension reachable by the current photolithography technology. Incidentally, a direction along which the lines of the photoresist layer 14 extend is called a Y-axis direction, and a direction perpendicular to the Y-axis direction is called an X-axis direction, as shown in FIG. 1, hereinafter.

Next, the patterned photoresist layer 14 is slimmed, so that the line width of the photoresist layer 14 becomes narrower to about 30+/−3 nm and the space width becomes wider to about 90+/−9 nm. Such slimming is carried out by, for example, plasma etching employing oxygen plasma and the like. Then, when the BARC 13 is etched using the slimmed photoresist layer 14 as a mask, the amorphous silicon layer 12 is exposed, as shown in the subsection (d) of FIG. 1. This etching of the BARC 13 is carried out by, for example, plasma etching employing oxygen plasma and the like. Therefore, slimming the photoresist layer 14 and etching the BARC 13 may be carried out in a single process.

Next, a silicon oxide layer 15 is deposited on upper surfaces of the amorphous silicon layer 12 and the photoresist layer 14 and side surfaces of the photoresist layer 14 and the BARC 13 (the subsection (e) of FIG. 1). This deposition may be carried out by chemical vapor deposition utilizing a heated catalyst, molecular layer deposition (MLD) employing bis (tertiary-butylamino) silane (BTBAS) and ozone, and the like. Because these deposition methods enable a low temperature (e.g., 300° C. or less) deposition, the silicon oxide layer 15 is preferably deposited even on the upper and the side surfaces of the photoresist layer 14. In addition, a thickness of the silicon oxide layer 15 is adjusted to be about 30+/−3 nm, which is substantially the same as the line width of the photoresist layer 14, on the upper surfaces of the amorphous silicon layer 12 and the photoresist layer 14 and on the side surfaces of the photoresist layer 14 and the BARC 13. Such adjustment can be relatively easily made when the MLD method, which enables conformal deposition, is used. Because the photoresist layer 14 has the line-and-space pattern, the silicon oxide layer 15 also has the line-and-space pattern after etching. In this case, lines of the silicon oxide layer 15 extend along the Y-axis direction (a direction perpendicular to the paper surface of FIG. 1), and the space width of the lines of the silicon oxide layer 15 is about 30+/−3 nm.

Next, the silicon oxide layer 15 is etched back so that the photoresist layer 14 and the amorphous layer 12 are exposed, as shown in the subsection (f) of FIG. 1. This etching may be carried out using, for example, a gas mixture of Ar gas and a CF group gas such as $CF_4$, $C_4F_8$, $CHF_3$, $CH_3F$, and $CH_2F_2$. In addition, oxygen may be added to the gas mixture, if necessary. After this etching, the silicon oxide layer 15 remains only on the side surfaces of the photoresist layer 14 and the BARC 13. The silicon oxide layer 15 remaining on the side surfaces of photoresist layer 14 and the BARC 13 has a line width of about 30+/−3 nm and a space width of about 30+/−3 nm (a pitch of about 60+/−6 nm).

Then, when the photoresist layer 14 and the BARC 13 are removed by an ashing process using oxygen plasma and the like, the silicon oxide layer 15 having the line-and-space pattern with the line width of about 30+/−3 nm and the space width of about 30+/−3 nm is formed, as shown in the subsection (g) of FIG. 1.

Next, the amorphous layer 12 is etched using the silicon oxide layer 15 as a mask. This etching may be carried out using HBr gas and the like. With this, portions of the amorphous layer 12 that are not covered by the silicon oxide layer 15 are removed, so that the silicon nitride layer 11 is exposed, as shown in the subsection (h) of FIG. 1. Subsequently, when the silicon oxide layer 15 on the amorphous silicon layer 12 is removed by an etching process using the CF group gas and the like, the amorphous silicon layer 12 having a line-and-space pattern is left on the silicon nitride layer 11, as shown in the subsection (i) of FIG. 1.

Next, another BARC 23 is formed on the silicon nitride layer 11 to bury the amorphous silicon layer 12. Because the BARC 23 is formed by a spin-coating process using a liquid source, an upper surface of the BARC 23 can be substantially flat due to flowability of the liquid source. Then, a photoresist layer 24 is formed on the BARC 23, as shown in the subsection (j) of FIG. 1.

Subsequently, the photoresist layer 24 is exposed to exposure light through a predetermined mask and developed, and thus patterned, as shown in the subsections (a1) and (b1) of FIG. 2. The patterned photoresist layer has the line-and-space pattern, similar to the photoresist layer 14 (the subsection (b) of FIG. 1). In this example, the patterned photoresist layer 24 has a line width of about 60+/−6 nm and a line width of about 60+/−6 nm. A longitudinal direction of the lines (spaces) of the photoresist layer 24 intersects the longitudinal direction of the lines (spaces) of the amorphous silicon layer 12. In the illustrated example, the photoresist layer 24 extends in the X-axis direction, while the amorphous layer 12 extends in the Y-axis direction.

Next, the photoresist layer 24 is slimmed using oxygen plasma and the like, which decreases the line width of the photoresist layer 24 to about 30+/−3 nm and increases the space width of the photoresist layer 24 to about 90+/−9 nm (the subsections (a2) and (b2) of FIG. 2). Then, when the BARC 23 is etched using the photoresist layer 24 as a mask, the underlying layer is exposed. Specifically, the amorphous silicon layer 12 is exposed in the subsection (a3) of FIG. 2, and the silicon nitride layer 11 is exposed in the subsection (b3) of FIG. 2.

Next, a silicon oxide layer 25 is deposited on the amorphous silicon layer 12 and the silicon nitride layer 11 in order to cover the photoresist layer 24 and the BARC 23, as shown in the subsection (a4) of FIG. 2. This deposition may be carried out by chemical vapor deposition utilizing a heated catalyst, or molecular layer deposition (MLD), similar to the deposition of the silicon oxide layer 15. The silicon oxide layer 25 has a thickness of about 30+/3 nm on upper surfaces of the photoresist layer 24, the amorphous silicon layer 12 and the silicon nitride layer 11 and on side surfaces of the photoresist layer 24 and the BARC 23. Then, the silicon oxide layer 25 is etched back by about 30+/−3 nm, and thus the upper surfaces of the photoresist layer 24, the amorphous silicon layer 12, and the silicon nitride layer 11 are exposed, as shown in the subsections (a5) and (b5) of FIG. 2.

Next, the photoresist layer 24 and the underlying BARC 23 are removed by an ashing process using oxygen plasma. With this, a structure shown in FIG. 3 is obtained. Referring to the subsection (a) of FIG. 3, which is a plan view, a lattice pattern, where the silicon oxide layer 25 having the line-and-space pattern and the amorphous layer 12 having the line-and-space pattern are stacked one above the other and intersect each other, is observed. In openings of the lattice (portions surrounded by beams of the lattice), the silicon nitride layer 11 is exposed. As shown in the subsection (b) of FIG. 3, the amorphous silicon layer 12 is formed on the silicon nitride layer 11 and the silicon oxide layer 25 is formed on the amorphous silicon layer 12 in a cross section taken along a dashed line extending in a longitudinal direction of the amorphous silicon layer 12 (Y-axis direction in the illustrated example). Additionally, as shown in the subsection (c) of FIG. 3, the silicon oxide layer 25 is formed directly on the silicon nitride layer 11 in a cross section taken along a dashed line extending in the Y-axis direction between lines of the amorphous silicon layer 12.

On the other hand, as shown in the subsection (e) of FIG. 3, the lines of the amorphous silicon layer 12 are arrayed at a predetermined pitch, and the silicon oxide layer 25 is formed to bury the amorphous silicon layer 12. Additionally, as shown in the subsection (d) of FIG. 3, the lines of the amorphous silicon layer 12 are arrayed at a predetermined pitch without being buried by the silicon nitride layer 25.

Next, when the amorphous silicon layer 12 is etched using the silicon oxide layer 25 as a mask, the silicon oxide layer 25 having the line-and-space pattern remains and the silicon nitride layer 11 is exposed between the lines of the silicon oxide layer 25, as shown in the subsection (a) of FIG. 4, which is a plan view. Here, referring to the subsection (e) of FIG. 4, the lines of the amorphous silicon layer 12 are arrayed below and along the longitudinal direction of the silicon oxide layer 15 at a predetermined pitch. A width of the amorphous silicon layer 12 (line width) is about 30+/−3 nm and a spacing (space width) is also 30+/−3 nm.

Then, the silicon oxide layer 25 is removed, and as a result, amorphous silicon dots 120 arranged in an array are obtained from the amorphous silicon layer 12 on the silicon nitride layer 11, as shown in FIG. 5. After this, the silicon nitride layer 11 is etched using the CF group gas with the amorphous silicon dots 120 used as a mask, according to which portions of the silicon nitride layer 11 that are not covered by the amorphous silicon dots 120 are removed, so that the silicon wafer 10 is exposed, and other portions of the silicon nitride layer that are covered by the amorphous silicon dots 120 remain. Next, the silicon wafer 10 is etched by, for example, a dry-etching process using HBr, HCl and the like with the amorphous silicon dots 120 used as a mask. Then, the mask is removed by an etching process using the CF group gas and the like. As a result, silicon pillars 100 are obtained as shown in FIG. 6.

According to the semiconductor device fabrication method of the first embodiment of the present invention, the second layer (amorphous silicon layer) 12 is etched using the fifth layer (silicon oxide layer) 15 having a line-and-space pattern extending along one direction as a mask, which processes the second layer (amorphous silicon layer) 12 into a line-and-space pattern; and this second layer (amorphous silicon layer) 12 is then etched using the eighth layer (silicon oxide layer) 25 having a line-and-space pattern extending along another direction intersecting the one direction as a mask, thereby forming the dots (amorphous silicon dots) 120. Then, the underlying first layer (silicon nitride layer) 11 is etched using the dots (amorphous silicon dots) 120, resulting in the dots of the first layer (silicon nitride layer) 11 and the dots (amorphous silicon dots) 120 that are stacked on the corresponding first layer (silicon nitride) dots. Finally, the substrate (silicon wafer) 10 is etched using the dots, thereby forming the pillars 100 on the substrate (silicon wafer) 10.

As described above, while the photoresist layer 14 (the subsection (a) of FIG. 1, the subsections (a1) and (b1) of FIG. 2) has the line and space widths of about 60+/−6 nm, which is comparable with the lowest reachable dimension (critical dimension) available by the conventional (or current) photolithography technology, the obtained pillars 100 have the line and space widths of about 30+/−3 nm. Therefore, according to this embodiment, the pillars 100 having line and space widths lower than the critical dimension of the photolithography technology are obtained. In this particular embodiment, the pillars 100 have about half a critical dimension.

Incidentally, when the substrate 10 is a silicon wafer, the substrate 10 may be anisotropically etched due to etching rate differences along crystallographic orientations of the silicon crystal, which allows each pillar 100 to have the shape of a solid cylinder. Even in this case, the pillars having diameters of 30+/−3 nm, which is lower than the critical dimension of the photolithography technology, can be obtained.

Second Embodiment

Next, a semiconductor device fabrication method according to a second embodiment of the present invention is explained. Also in the second embodiment, the first layer 11, the second layer 12, the third layer 13, and the fourth layer 14 are formed in this order on the substrate 10. The functions of these layers and relationships of one layer to another are the same as those explained in the first embodiment.

The semiconductor device fabrication method according to the second embodiment is different from the first embodiment in that a planarization process is carried out between etching the second layer 14 and forming the sixth layer 23. The following explanation is focused on the difference, and repetitive explanations are omitted.

First, a series of processes from forming the four layers through etching the second layer 12 are carried out as explained in the first embodiment. Namely, the processes explained with reference to the subsections (a) through (i) of FIG. 1 are carried out. A cross section of the semiconductor device in the fabrication process, obtained after these processes are completed, is illustrated in a subsection (a) of FIG. 7. Next, a ninth layer 35 is deposited over the first layer 11 to bury the second layer 12 remaining on the first layer 11. Because the ninth layer 35 is subjected to a chemical mechanical polishing (CMP) process for planarizaion (described layer), the ninth layer 35 is formed so that the gaps (spaces) between lines of the second layer 12 are filled and an appropriate polishing rate is obtained with respect to the second layer 12.

Figure 7:
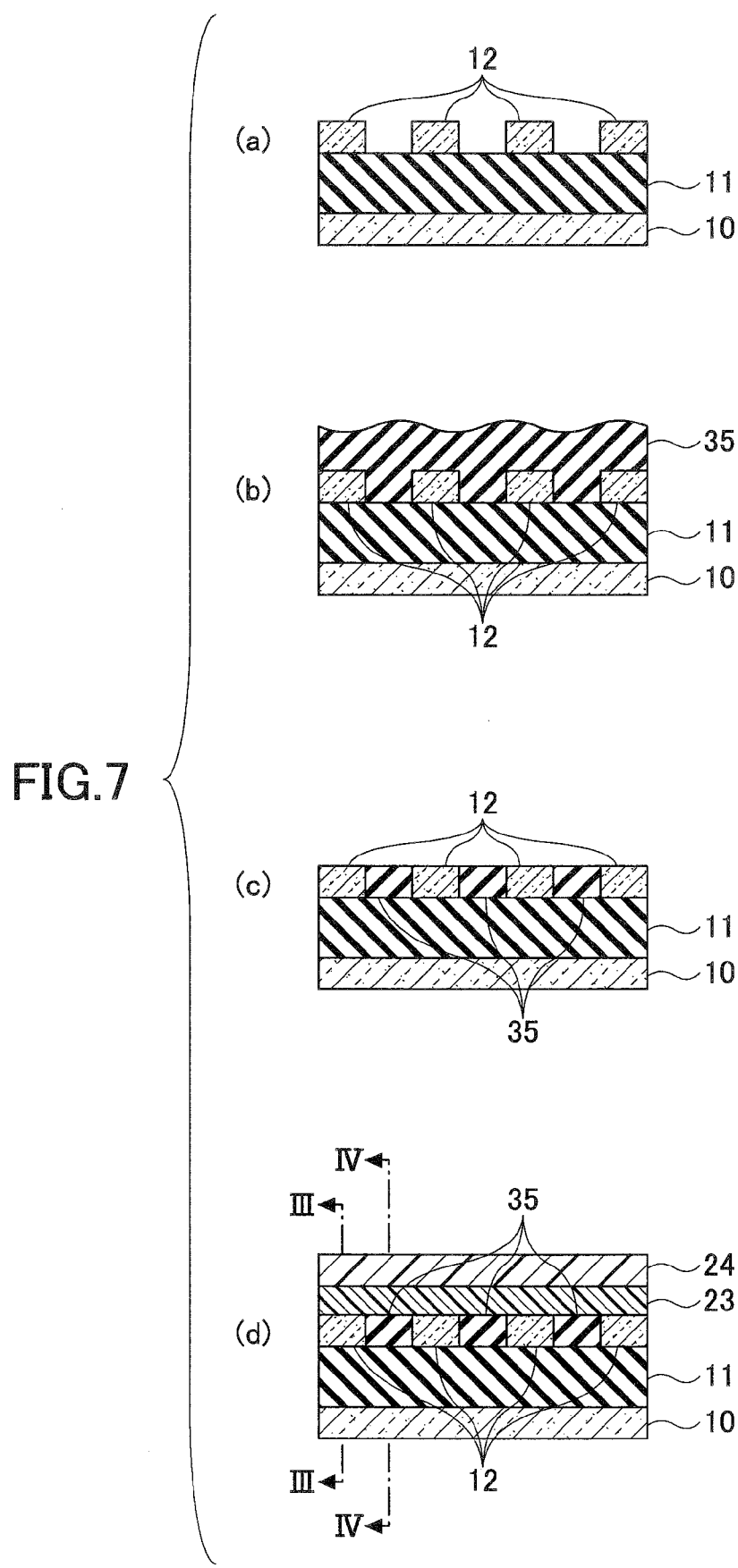
FIG. 7 schematically illustrates a semiconductor device fabrication method according to a second embodiment of the present invention.

Then, the CMP process is carried out to planarize the upper surface of the ninth layer 35 (a subsection (c) of FIG. 7), for example, with predetermined endpoint detection used until the second layer 12 is exposed. After this planarization, a sixth layer 23 and a seventh layer 24 are formed in this order on the planarized second layer 12 and ninth layer 35 (a subsection (d) of FIG. 7).

Figure 8:
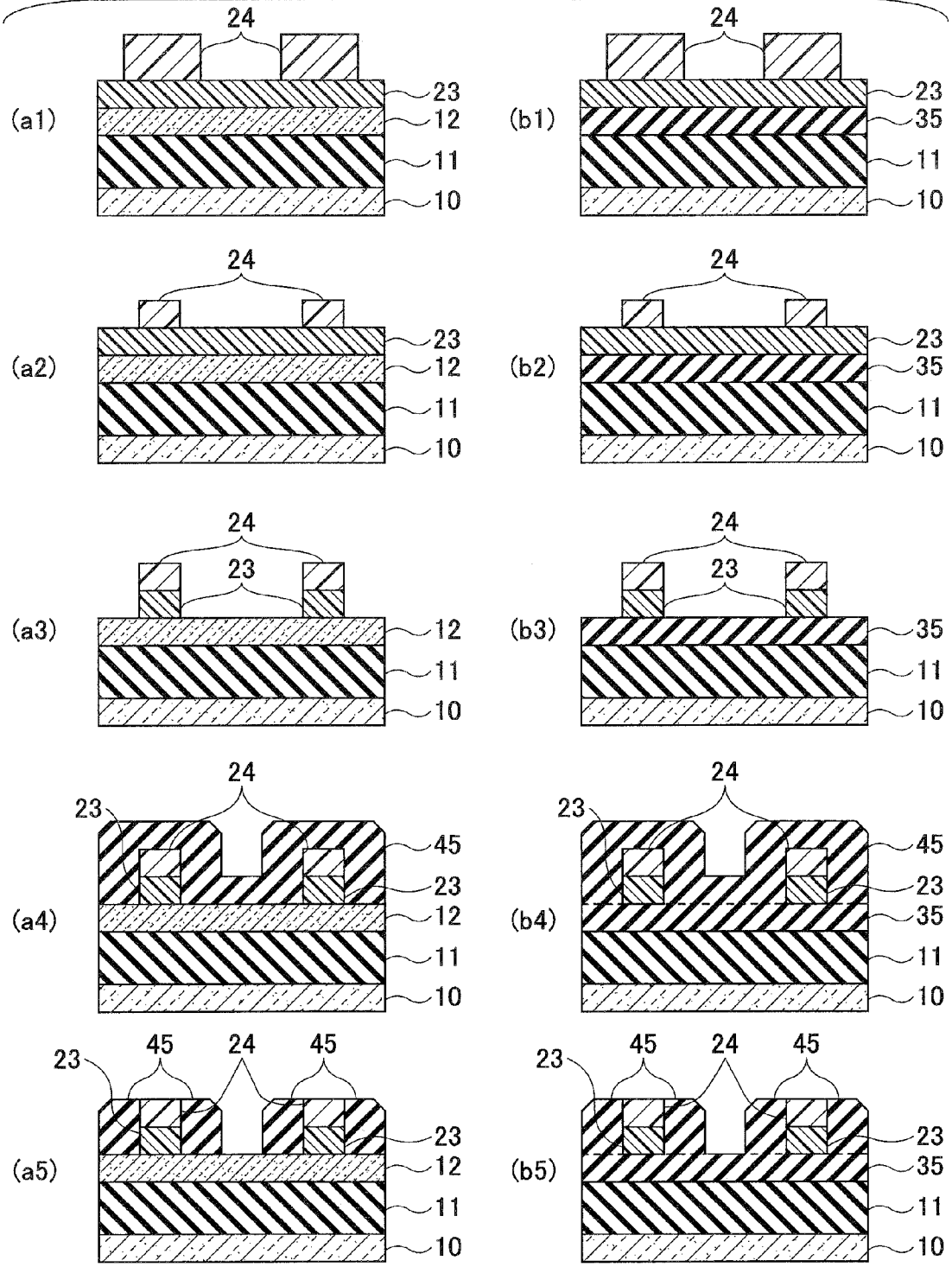
FIG. 8 schematically illustrates the semiconductor device fabrication method according to the second embodiment, in succession to FIG. 7.

Referring to FIG. 8, the subsequent processes are explained. Subsections (a1) through (a5) correspond to cross-sectional views taken along line in the subsection (d) of FIG. 7, and subsections (b1) through (b5) correspond to cross-sectional views taken along the IV-IV line in the subsection (d) of FIG. 7.

Referring to the subsections (a1) and (b1) of FIG. 8, the seventh layer 24 is patterned into a predetermined shape. The patterned seventh layer 24 extends in a direction intersecting the extending direction of the second layer 12. In addition, referring to the subsection (a1) of FIG. 8, the first layer 11, the second layer 12, and the sixth layer 23 are stacked in this order on the substrate 10 and the seventh layer 24 is formed on the sixth layer 23. On the other hand, referring to the subsection (b1) of FIG. 8, the first layer 11, the ninth layer 35, and the sixth layer 23 are stacked in this order on the substrate 10 and the patterned seventh layer 24 is formed on the sixth layer 23. Namely, the ninth layer 35 is formed on the first layer 11 in the subsection (b1) of FIG. 8, instead of the second layer 12 in the subsection (a1) of FIG. 8. This ninth layer 35 remains after being used for the planarization. In addition, the difference between the layers produced with and without the planarization process can be understood by comparing the subsection (b1) of FIG. 8 with the subsection (b1) of FIG. 2.

Next, the seventh layer 24 is shrunk as shown in subsections (a2) and (b2) of FIG. 8, thereby forming an etching mask for etching the underlying sixth layer 23.

Then, the sixth layer 23 is etched using the shrunk seventh layer 24 as an etching mask, and thus the sixth layer 23 now has substantially the same plan view shape as that of the mask, as shown in subsections (a3) and (b3) of FIG. 8. Incidentally, the second layer 12 is exposed in the subsection (a3) of FIG. 8, and the ninth layer 35 is exposed in the subsection (b3) of FIG. 8.

Subsequently, a tenth layer 45 is deposited over the second layer 12 and the ninth layer 35 to cover the seventh layer 24 and the sixth layer 23 (subsections (a4) and (b4) of FIG. 8). This deposition can be carried out by chemical vapor deposition utilizing a heated catalyst, or molecular layer deposition (MLD), similar to the deposition of the fifth layer 15 (the subsection (e) of FIG. 1). After this, the tenth layer 45 is etched back, so that the seventh layer 24, the ninth layer 35, and the second layer 12 are exposed (subsections (a5) and (b5) of FIG. 8).

Figure 9:
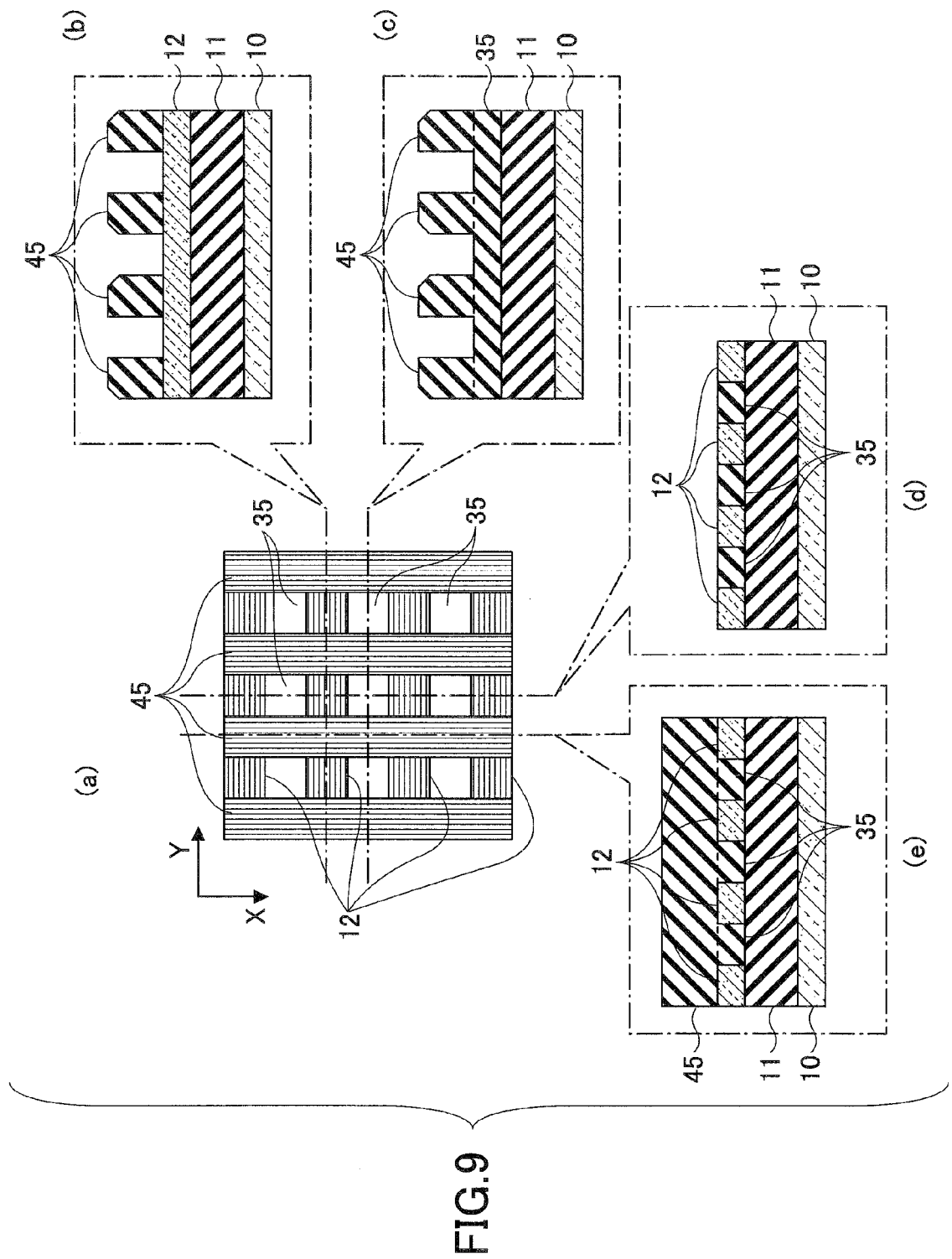
FIG. 9 schematically illustrates the semiconductor device fabrication method according to the second embodiment, in succession to FIG. 8.

Then, when the seventh layer 24 and the sixth layer 23 are removed, a structure shown in FIG. 9 is obtained. Referring to a subsection (a) of FIG. 9, which is a plan view, a lattice pattern where the tenth layer 45 and the second layer 12 are stacked one above the other and intersect each other is observed. In openings of the lattice, the first layer 11 is exposed.

As shown in a subsection (b) of FIG. 9, the second layer 12 is formed on the first layer 11, and the tenth layer 45 is formed on the second layer 12 in a cross section taken along a dashed line extending in a longitudinal direction of the second layer 12 (Y-axis direction). Additionally, as shown in a subsection (c) of FIG. 9, the ninth layer 35 is formed on the first layer 11, and the tenth layer 45 is formed on the ninth layer 35 in a cross section taken along a dashed line extending in the Y-axis direction between lines of the second layer 12. On the other hand, the second layer 12 and the ninth layer 35 are alternately arrayed on the first layer 11, and the tenth layer 45 is formed on these layers in a cross section taken along a dashed line extending a longitudinal direction of the tenth layer 45 (X-direction), as shown in a subsection (e) of FIG. 9. In addition, as shown in a subsection (d) of FIG. 9, the second layer 12 and the ninth layer 35 are alternately arrayed on the first layer 11 in a cross section taken along a dashed line extending between lines of the tenth layer 45.

Figure 10:
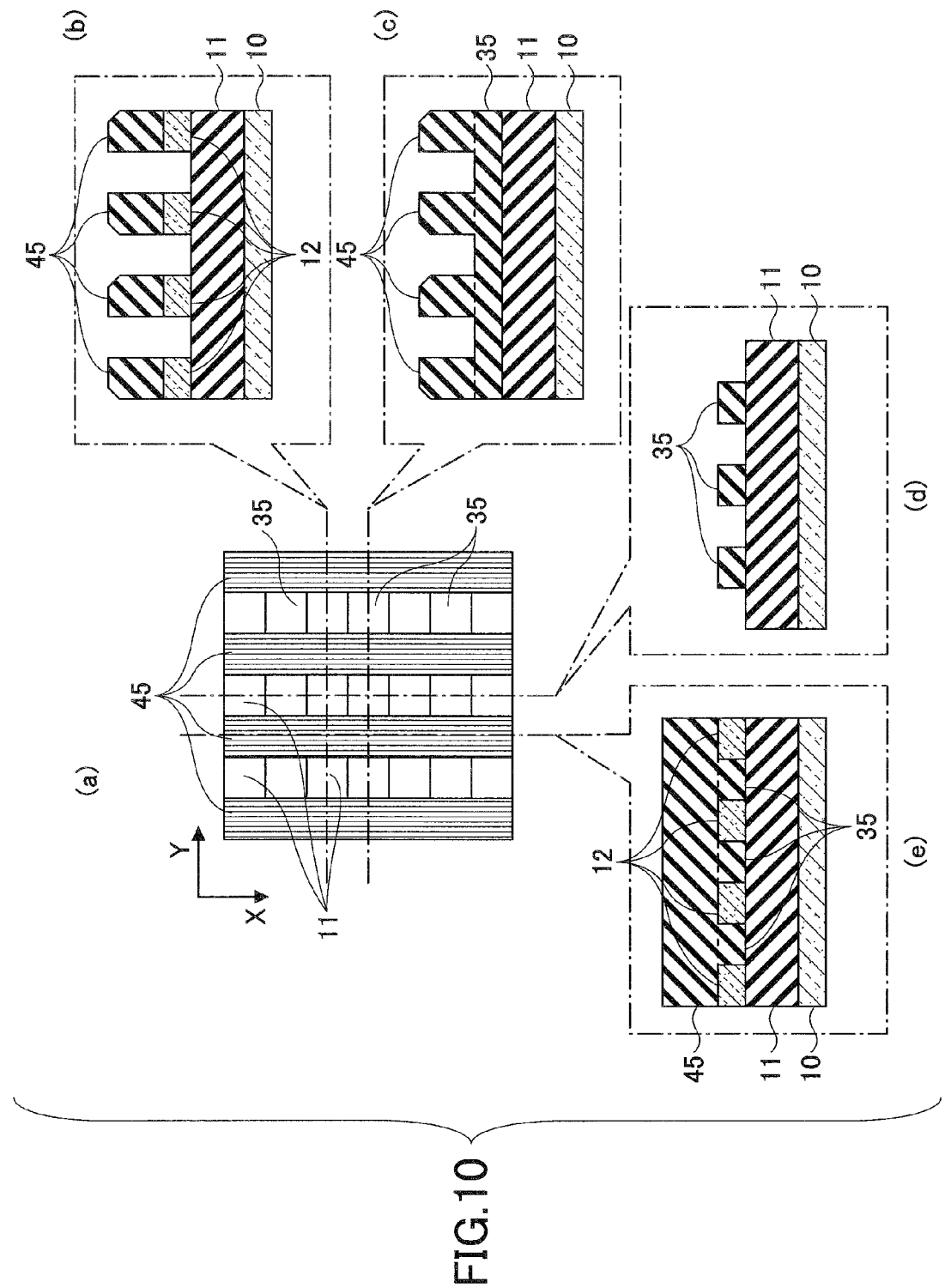
FIG. 10 schematically illustrates the semiconductor device fabrication method according to the second embodiment, in succession to FIG. 9.

Next, the second layer 12 exposed between the lines of the tenth layer 45 is removed using the tenth layer 45 as a mask, and thus, the ninth layer 35 and the first layer 11 are alternately exposed between the lines of the tenth layer 45, as shown in subsections (a) and (d) of FIG. 10. In addition, as most appropriately illustrated in a subsection (e) of FIG. 10, the second layer 12 and the ninth layer 35 are alternately arrayed below the tenth layer 45.

Next, the tenth layer 45 and the ninth layer 35 are removed, and thus, dots 120 arranged in an array are obtained from the second layer 12 on the silicon nitride layer 11, as shown in FIG. 5. After this, the first layer 11 is etched using the dots 120 as a mask. With this etching, portions of the first layer 11 that are not covered by the dots 120 are removed, so that the substrate 10 is exposed, while the other portions of the first layer 11 that are covered by the dots 120 remain. Next, the substrate 10 is etched using the dots 120 and the first layer 11 remaining below the dots 120 as a mask. Then, after the dots 120 and the first layer 11 remaining below the dots 120 are removed, pillars 100 are obtained on the substrate 10, as shown in FIG. 6.

Even in the second embodiment, the pillars 100 can be formed on the substrate 10 by combining various materials as explained in the first embodiment. As a preferable combination, it may be that the first layer 11 is made of silicon nitride, the second layer 12 is made of amorphous silicon, the third layer 13 is an antireflection layer, the fourth layer 14 is a photoresist layer, and the substrate 10 is a silicon wafer, which is the same combination used in Example 1 of the first embodiment. The semiconductor device fabrication method according to the second embodiment of the present invention may be specifically practiced by referring to Example 1 of the first embodiment, with various combinations of the materials exemplified in Example 1. In the second embodiment, the ninth layer 35 for use in the planarization process is preferably made of silicon oxide. The deposition may be carried out by chemical vapor deposition utilizing a heated catalyst, molecular layer deposition (MLD) employing BTBAS and ozone, and the like. However, because the fourth layer 14, which is preferably made of photoresist, is removed before depositing the ninth layer 35 in the second embodiment, a low temperature deposition method is not necessary. Therefore, the ninth layer 35 may be deposited by a plasma-assisted CVD method employing, for example, tetraethoxysilane (TEOS). Additionally, a film deposition method that enables less or non-conformal silicon oxide deposition is preferably used from a viewpoint of filling the gap between the lines of the second layer 12, which is preferably made of amorphous silicon.

As stated above, the second embodiment of the present invention can provide the same advantages as the first embodiment. In addition, because the ninth layer 35 is deposited after the second layer 12 having the line-and-space pattern is formed and the planarization process is carried out, the seventh layer 27 (the subsections (a1) and (b1) of FIG. 8) having the line-and-space pattern can be obtained with higher precision. Therefore, dimensional precision of the pillars 100 can be improved as a whole.

However, the semiconductor device fabrication method according to the first embodiment, which does not include the planarization process, is advantageous in that the semiconductor devices are fabricated at lower production costs. Namely, the first and the second embodiments may be selected depending on the production costs and the dimensional precision (yield).

Third Embodiment

Next, a semiconductor device fabrication method according to a third embodiment of the present invention is explained.

The third embodiment is different from the first embodiment in that an eleventh layer is first deposited on the substrate 10 and then the first layer 11, the second layer 12, the third layer 13, and the fourth layer 14 are formed in this order. In addition, the semiconductor device fabrication method according to the third embodiment is different in the process explained with reference to FIG. 3 and the subsequent processes from the first embodiment. The following explanation is focused on such differences, and repetitive explanations are omitted.

Figure 11:
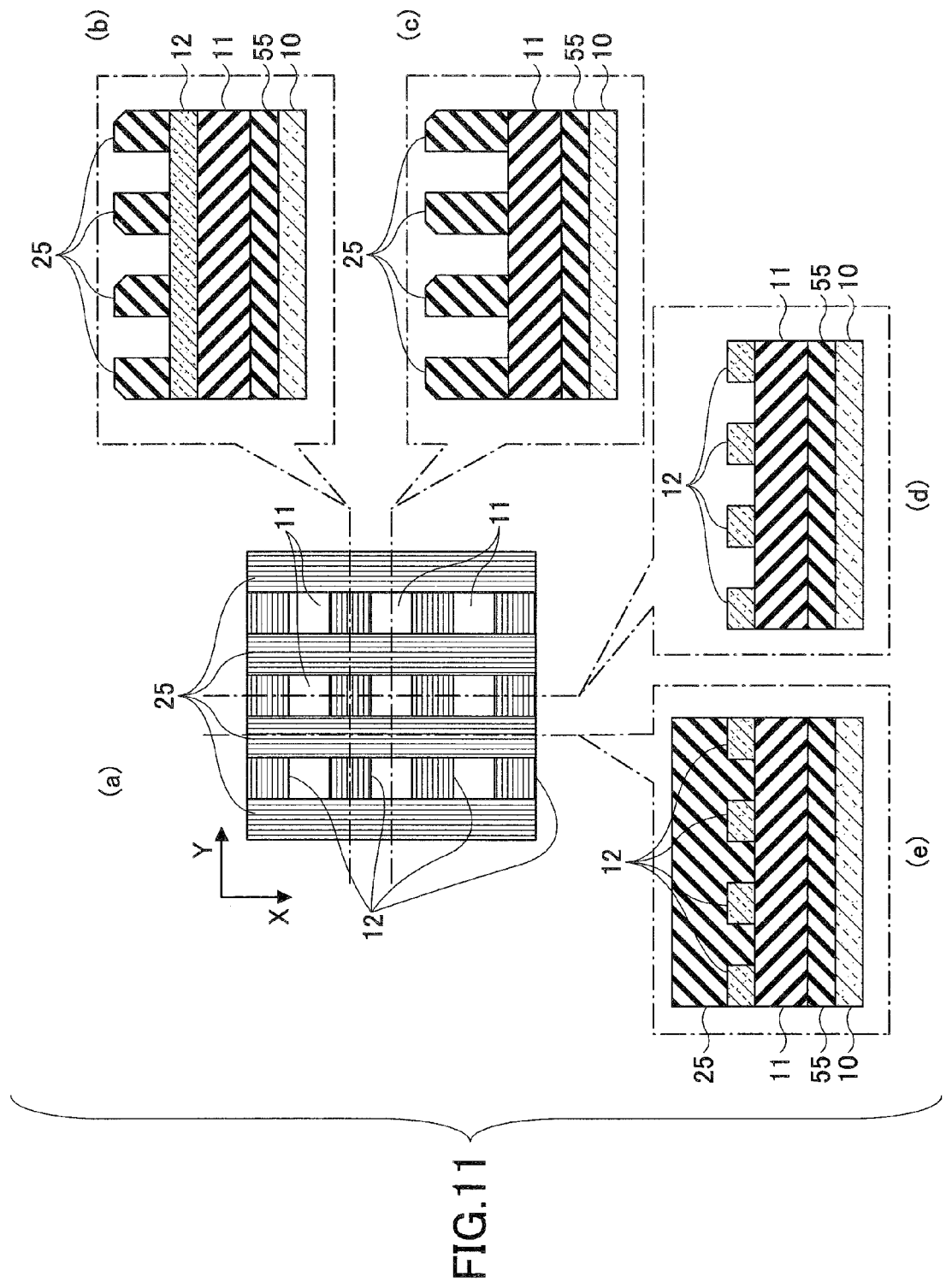
FIG. 11 schematically illustrates the semiconductor device fabrication method according to the second embodiment, in succession to FIG. 10.

First, the eleventh layer (an eleventh layer 55 hereinafter), the first layer 11, the second layer 12, the third layer 13, and the fourth layer 14 are formed in this order on the substrate 10. Next, the processes explained with reference to FIGS. 1 through 3 are carried out, and thus a structure shown in FIG. 11 is obtained. Referring to a subsection (a) of FIG. 11, which is a plan view, a lattice pattern composed of the eighth layer 25 having a line-and-space pattern extending in one direction and the second layer 12 having a line-and-space pattern extending in another direction intersecting the one direction is obtained. In openings of the lattice, the first layer 11 is exposed.

In addition, subsections (b) through (e) of FIG. 11 correspond to cross sections taken along respective dashed lines in the subsection (a) of FIG. 11. From these cross sections, it can be understood that structures above the first layer 11 are the same as those shown in the subsections (b) through (e) of FIG. 3 while the eleventh layer 55 is formed between the substrate 10 and the first layer 11.

Next, the first layer 11 exposed in the openings of the lattice is etched using the eighth layer 25 and the second layer 12 as a lattice-shaped mask. With this etching, holes 110 are formed in the first layer 11, and the eleventh layer 55 is exposed at the bottom of the holes 110, as shown in a subsection (a) of FIG. 12.

Next, the eleventh layer 55 exposed in the bottom of the holes 110 is etched using the second layer 12 and the first layer 11 having the holes 110 formed. With this etching, holes 550 are formed to be two-dimensionally arranged in the eleventh layer 55 (a subsection (b) of FIG. 12). Then, the second layer 12 remaining on the eleventh layer 55 and the first layer 11 is removed.

Figure 12:
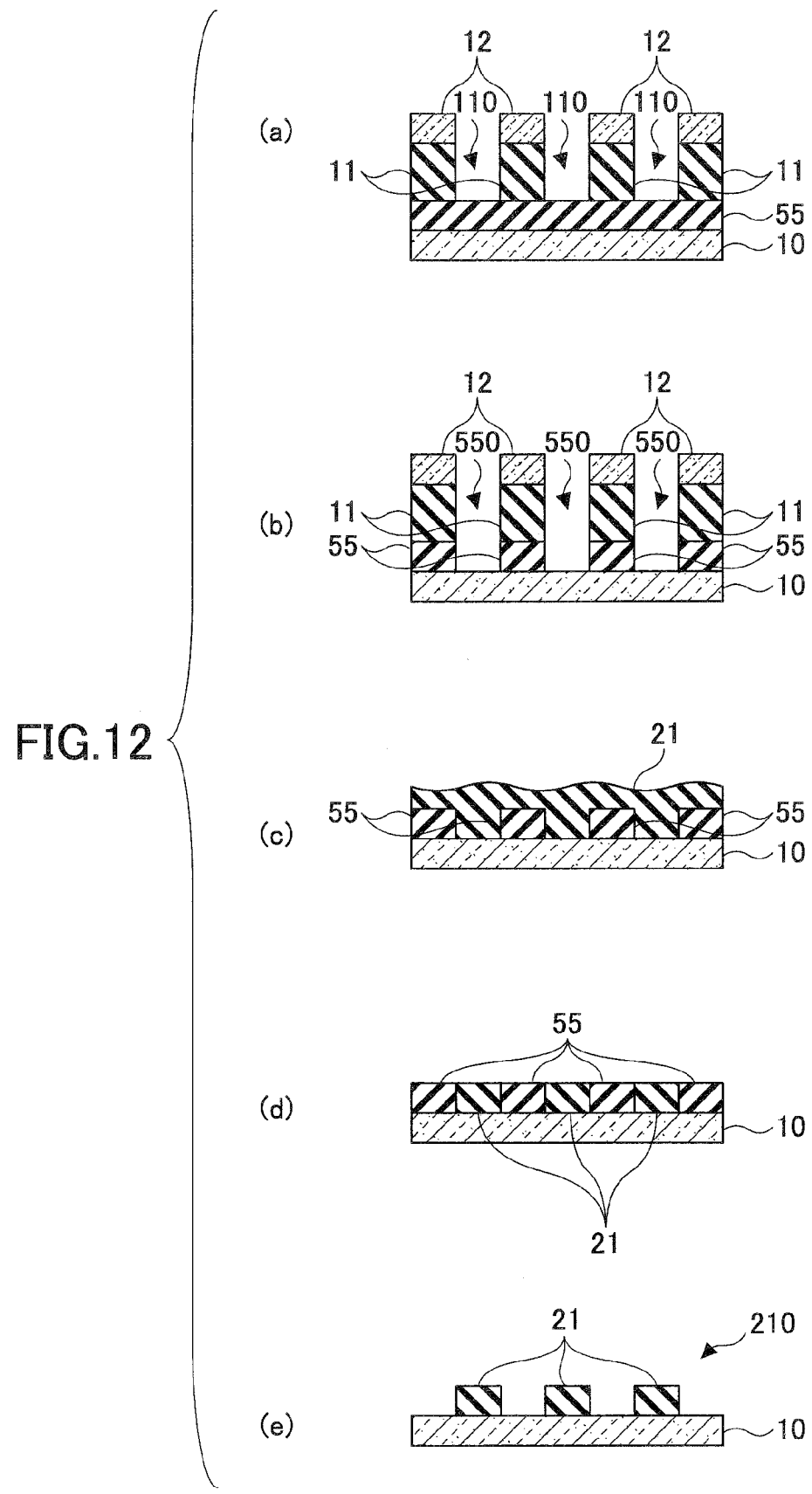
FIG. 12 schematically illustrates a semiconductor device fabrication method according to a third embodiment of the present invention.

Next, a twelfth layer 21 is deposited on the eleventh layer 55 in order to bury the holes 550 with the twelfth layer 21, as shown in a subsection (c) of FIG. 12. Then, the twelfth layer 21 is thinned by etching or CMP, so that the upper surface of the eleventh layer 55 is exposed (a subsection (d) of FIG. 12).

Next, when the eleventh layer 55 is removed, dots 210 are formed on the substrate 10 as shown in a subsection (e) of FIG. 12. The dots 210 are formed from the twelfth layer 21 that has filled the holes 550 of the eleventh layer 55. Namely, the holes 550 of the eleventh layer 55 are transformed into the dots 210 by the processes explained with reference to the subsections (a) through (e) of FIG. 12.

Subsequently, when the substrate 10 is etched using the dots 210 as a mask, the pillars 100 are two-dimensionally arranged on the substrate 10, in the same manner illustrated in FIG. 6.

Incidentally, each of the dots 210 has a thickness that allows the dots 210 to remain after the substrate 10 is etched. Therefore, the thickness (height) T210 of the dots 210 is preferably determined to satisfy the following expression:

$$T210 \geq R11 \times (D10/R10).$$

Hence, $$T210 \geq D10 \times ER10 \quad (5)$$

where

D10 is an etching depth of the substrate 10 (a height of the pillars 100),

R10 is an etching rate of the substrate 10,

R210 is an etching rate of the dots 210 when the substrate 10 is etched, and

ER10 is an etching ratio (=R11/R10).

In addition, because the dots 210 used as an etching mask for the substrate 10 are formed by the holes 550 of the eleventh layer 55, the thickness T210 of each of the dots 210 is determined by a thickness T55 of the eleventh layer 55. Therefore, the thickness T55 of the eleventh layer 55 is preferably determined to satisfy the following expression:

$$T55 = T210 \geq R11 \times (D10/R10)$$

Hence, $$T55 = T210 \geq D10 \times ER10 \quad (5)$$

where

D10 is an etching depth of the substrate 10 (a height of the pillars 100),

R10 is an etching rate of the substrate 10,

R210 is an etching rate of the dots 210 when the substrate 10 is etched, and

ER10 is an etching ratio (=R11/R10).

Even in the third embodiment, the pillars 100 can be formed on the substrate 10 by combining various materials as explained in the first embodiment. As a preferable combination, it may be that the first layer 11 is made of silicon nitride, the second layer 12 is made of amorphous silicon, the third layer 13 is an antireflection layer, the fourth layer 14 is a photoresist layer, and the substrate 10 is a silicon wafer, which is the same combination used in Example 1 of the first embodiment. In this case, the eleventh layer 55 is preferably made of silicon oxide and the twelfth layer 21 is preferably made of silicon nitride. The semiconductor device fabrication method according to the second embodiment of the present invention may be specifically practiced by referring to Example 1 of the first embodiment, with various combinations of materials exemplified in Example 1.

Incidentally, when the eleventh layer 55 is made of silicon oxide, the silicon oxide layer 55 may be formed by thermally oxidizing the silicon wafer 10. In addition, the silicon oxide layer 55 may be formed by a CVD method including a plasma-assisted CVD method. Moreover, the twelfth layer 21 may be formed, when made of silicon nitride, in the same manner as the first layer 11, which is preferably made of silicon nitride.

According to the semiconductor device fabrication method of the third embodiment of the preset invention, the etching mask having the lattice pattern composed of the second layer 12 having a line-and-space pattern and the eighth layer 25 having a line-and-space pattern extending in another direction intersecting the one direction is formed, and the underlying first layer 11 is etched using the etching mask of the lattice pattern, thereby forming the two-dimensionally arranged holes 110 in the first layer 11. In addition, the eleventh layer 55, which is the underlying layer of the first layer 11, is etched, and as a result, the holes 550 are formed in the eleventh layer 55. Moreover, the twelfth layer 21 is deposited to fill the holes 550; the twelfth layer 21 is exposed by etching or CMP; and the eleventh layer 55 is removed, thereby forming the dots 210. The dots 210 are used to etch the substrate 10, and as a result, the pillars 100 are obtained (FIG. 6).

In a manner similar to the first embodiment, because the eighth layer 25 and the second layer 12 have the line-and-space pattern with line and space widths of about 30+/−3 nm, the pillars 100 may have a square top view shape having a side of about 30+/−3 nm and a space of about 30+/−3 nm between the adjacent pillars 100. Namely, even according to the semiconductor device fabrication method of the third embodiment, the pillars 100 have line and space widths of about 30+/−3 nm that are less than the critical dimension of the photolithography technology.

In addition, in the semiconductor device fabrication method according to the third embodiment of the present invention, the pillars 100 are positioned corresponding to the openings of the lattice composed of the eighth layer 25 and the second layer 12, which is in contrast to the semiconductor device fabrication methods according to the first and the second embodiments where the pillars 100 are positioned corresponding to the lattice points of the lattice composed of the eighth layer 25 and the second layer 12.

In the third embodiment, the twelfth layer 21 may be formed by a coating method employing liquid sources such as photoresist, polyimide, spin-on-glass, and the like. With this, the holes 550 of the eleventh layer 55 can be filled in.

While the present invention has been described with reference to the foregoing embodiments and examples, the present invention is not limited to the disclosed embodiments and examples, but may be modified or altered within the scope of the accompanying claims.

For example, while the fourth layer 14 and the seventh layer 24 may have the same pattern having the same line and space widths, the layers 14, 24 may have different line and space widths, which results in the pillars 100 having a rectangular top view shape. Incidentally, even in this case, the pillars 100 may have an ellipsoid top view shape rather than a rectangular top view shape due to an anisotropic nature of etching rates depending on the crystallographic orientations.

Moreover, when the fourth layer 14 and the seventh layer 24 have different pitches, regions having a high density of the pillars 100 and a low density of the pillars 100 in a chip (die) may be obtained over the substrate 10.

Figure 13:
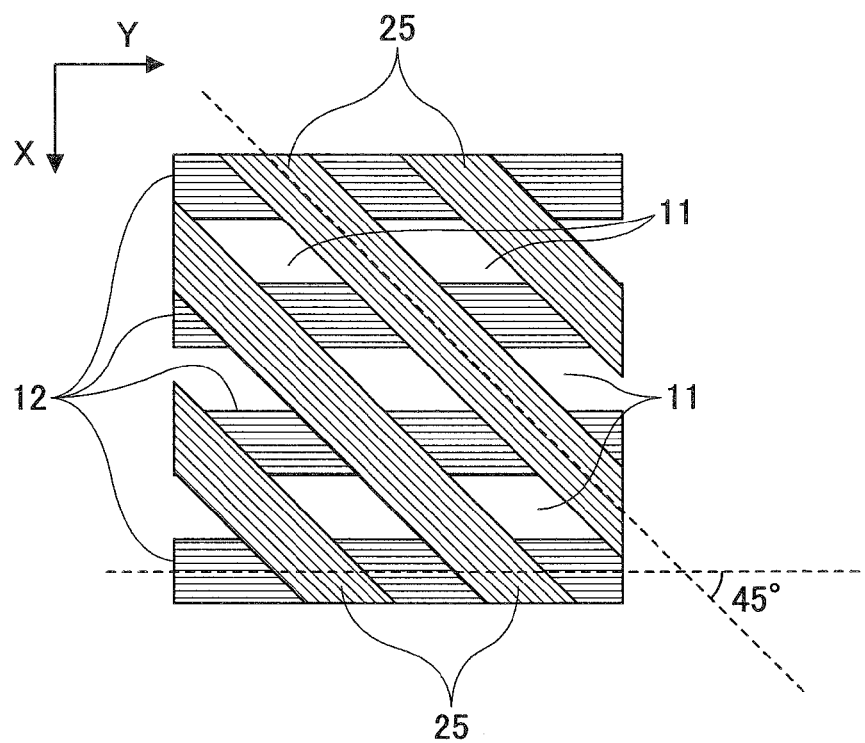
FIG. 13 is a plan view illustrating a modification example of an embodiment of the present invention.
Figure 14:
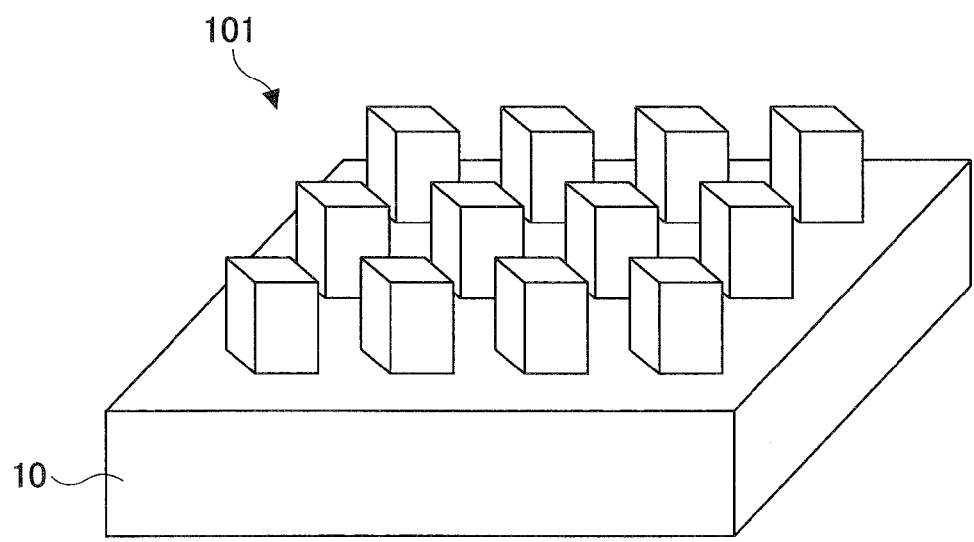
FIG. 14 is a perspective view illustrating pillars obtained by the modification example shown in FIG. 13.

Furthermore, while the second layer 12 and the eighth layer 25 (the tenth layer 45) run at right angles in the subsections (a) of FIGS. 3, 9, 11, and the like, the angle is not limited to the right angle. For example, the second layer 12 and the eighth layer 25 may intersect each other at an angle of 45°, as shown in FIG. 13, which is a top view corresponding to the subsections (a) of FIGS. 3, 9, 11, and the like. This can be realized by patterning the seventh layer 24 at an angle of 45° with respect to the second layer 12 in the process explained with reference to the subsection (j) of FIG. 1 and the subsections of (a1) and (b1) of FIG. 2. When the processes explained with reference to FIGS. 4 through 6 are carried out using the slanted lattice shown in FIG. 13, pillars 101 having a parallelogram top view shape are obtained as shown in FIG. 14. The pillars 101 may have an ellipsoid top view shape rather than a parallelogram top view shape due to an anisotropic nature of etching depending on the crystallographic orientations.

Incidentally, the silicon pillars formed on the substrate according to any one of the above embodiments and examples may be used to fabricate a stacked gate transistor (SGT) or a stacked-surrounding gate transistor (S-SGT). A structure of an SGT 112 is illustrated in FIG. 15 (see T. Endoh et. al., IEICE TRANSACTIONS ON ELECTRONICS, Vol. E80-C, No. 7, pp. 911-917, July, 1997). As shown, the substrate 10 includes a first silicon wafer 10a, a silicon oxide layer 10b, and a second silicon wafer 10c. On the substrate 10, there is formed the silicon pillar 100 (101) composed of a $n^+$-type silicon layer 104, a p-type silicon layer 103, and $n^+$-type silicon layer 102 stacked in this order. The silicon pillar 100 may be obtained by preparing an epitaxial wafer where $n^+$-type silicon film/p-type silicon film/$n^+$-type silicon film are deposited on the substrate 10 and applying the semiconductor device fabrication method according to an embodiment of the present invention to the epitaxial wafer. A gate insulation film 105 having a gate length L is formed around the silicon pillar 100 and a gate electrode 106 is formed to cover the gate insulation film 105. The SGT 112 so configured operates as a field effect transistor (FET) by applying a source-drain voltage across the $n^+$-type silicon layer 102 and the $n^+$-type silicon layer 104 and a predetermined voltage to the gate electrode 106.

In addition, the silicon pillar formed according to an embodiment of the present invention may serve as a basic structure for a cylindrical capacitor. Namely, such a cylindrical capacitor can be realized by forming an electrode that surrounds a circumferential side surface of the silicon pillar, a dielectric layer that surrounds the electrode, and another electrode that surrounds the dielectric layer.

Although the lowest dimension reachable by the current photolithography technology is explained as being about 60 nm in the above embodiments, when the lowest dimension is decreased due to further development of the photolithography technology, the dimension of the pillars 100 may be accordingly further decreased.

As a modification of the third embodiment, the processes explained with reference to the subsection (a) of FIG. 1 through FIG. 9 in the second embodiment and the process shown in FIG. 12 may be carried out. This modification corresponds to a semiconductor device fabrication method where the planarization process (the subsections (b) and (c) of FIG. 7) in the second embodiment is incorporated into the third embodiment.

What is claimed is:

1. A semiconductor device fabrication method comprising steps of:
    stacking a first layer, a second layer, a third layer, and a fourth layer in this order on a substrate;
    processing the fourth layer into a first mask layer having a first pattern of stripes extending in a first direction;
    processing the third layer using the first mask layer into a first sacrifice layer having the first pattern;
    forming a fifth layer to cover at least the first sacrifice layer;
    thinning the fifth layer so that the fifth layer remains on side walls of the first sacrifice layer;
    removing the first sacrifice layer to form a first side wall layer having a second pattern of stripes extending in the first direction;
    processing the second layer using the first side wall layer into a second mask layer having the second pattern;
    forming a sixth layer by a coating process using a liquid source in a liquid state thereby to bury the second mask layer, the sixth layer having a substantially flat upper surface;
    forming a seventh layer directly on the sixth layer;
    processing the seventh layer into a third mask layer having a third pattern of stripes extending in a second direction intersecting the first direction;
    processing the sixth layer using the third mask layer into a second sacrifice layer having the third pattern;
    forming an eighth layer to cover at least the second sacrifice layer;
    thinning the eighth layer so that the eighth layer remains on side walls of the second sacrifice layer;
    completely removing the entire second sacrifice layer to form a second side wall layer having a fourth pattern of stripes extending in the second direction; and
    processing the second mask layer using the second side wall layer into a fourth mask layer having dots arrayed in the first and the second directions.

2. The semiconductor device fabrication method of claim 1, wherein an angle made by the first direction and the second direction is about 90°.

3. The semiconductor device fabrication method of claim 1, wherein the substrate is made of silicon, the first layer is made of silicon nitride, the third layer is an antireflection layer, and the fourth layer is made of photoresist.

4. The semiconductor device fabrication method of claim 1, wherein the step of forming the sixth layer includes steps of:
    forming a first buried layer that buries the second layer; and
    planarizing the first buried layer,
    wherein the sixth layer is formed on the planarized first buried layer.

5. The semiconductor device fabrication method of claim 1, wherein the sixth layer is an antireflection layer and the seventh layer is made of photoresist.

6. The semiconductor device fabrication method of claim 1, wherein the coating process is a spin-coating process.

7. The semiconductor device fabrication method of claim 1, further comprising steps of:

processing the first layer using the fourth mask layer to from a fifth mask layer; and processing the substrate using the fifth mask layer.

8. A semiconductor device fabrication method comprising steps of:
- stacking a third sacrifice layer, a first layer, a second layer, a third layer, and a fourth layer in this order on a substrate;
- processing the fourth layer into a first mask layer having a first pattern of stripes extending in a first direction;
- processing the third layer using the first mask layer into a first sacrifice layer having the first pattern;
- forming a fifth layer to cover at least the first sacrifice layer;
- thinning the fifth layer so that the fifth layer remains on side walls of the first sacrifice layer;
- removing the first sacrifice layer to form a first side wall layer having a second pattern of stripes extending in the first direction;
- processing the second layer using the first side wall layer into a second mask layer having the second pattern;
- forming a sixth layer by a coating process using a liquid source in a liquid state thereby to bury the second mask layer, the sixth layer having a substantially flat upper surface;
- forming a seventh layer directly on the sixth layer;
- processing the seventh layer into a third mask layer having a third pattern of stripes extending in a second direction intersecting the first direction;
- processing the sixth layer using the third mask layer into a second sacrifice layer having the third pattern;
- forming an eighth layer to cover at least the second sacrifice layer;
- thinning the eighth layer so that the eighth layer remains on side walls of the second sacrifice layer;
- completely removing the entire second sacrifice layer to form a second side wall layer having a fourth pattern of stripes extending in the second direction; and
- processing the third sacrifice layer using the second side wall layer and the second mask layer to make holes that reach the substrate.

9. The semiconductor device fabrication method of claim 8, wherein the step of forming the sixth layer includes steps of:
- forming a first buried layer that buries the second layer; and
- planarizing the first buried layer,
- wherein the sixth layer is formed on the planarized first buried layer.

10. The semiconductor device fabrication method of claim 8, wherein the sixth layer is an antireflection layer and the seventh layer is made of photoresist.

11. The semiconductor device fabrication method of claim 8, wherein the coating process is a spin-coating process.

12. The semiconductor device fabrication method of claim 8, further comprising steps of:
- forming a second buried layer to fill in the holes;
- thinning the second buried layer to expose the third sacrifice layer;
- removing the third sacrifice layer to form a sixth mask layer from the second buried layer; and
- processing the substrate using the sixth mask layer.

* * * * *